(12) United States Patent
Takahashi

(10) Patent No.: US 10,032,822 B2
(45) Date of Patent: Jul. 24, 2018

(54) SOLID-STATE IMAGING DEVICE, METHOD FOR MANUFACTURING SAME, AND ELECTRONIC DEVICE

(71) Applicant: SONY CORPORATION, Tokyo (JP)

(72) Inventor: Hiroshi Takahashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/302,662

(22) PCT Filed: Apr. 8, 2015

(86) PCT No.: PCT/JP2015/060924
§ 371 (c)(1),
(2) Date: Oct. 7, 2016

(87) PCT Pub. No.: WO2015/159766
PCT Pub. Date: Oct. 22, 2015

(65) Prior Publication Data
US 2017/0033144 A1    Feb. 2, 2017

(30) Foreign Application Priority Data
Apr. 18, 2014   (JP) ................... 2014-086424

(51) Int. Cl.
*H01L 27/146* (2006.01)
*H01L 25/00* (2006.01)

(52) U.S. Cl.
CPC .... *H01L 27/14638* (2013.01); *H01L 27/1464* (2013.01); *H01L 27/1469* (2013.01);
(Continued)

(58) Field of Classification Search
CPC ................................................. H01L 27/1463
See application file for complete search history.

(56) References Cited

U.S. PATENT DOCUMENTS 7,796,174 B1 * 9/2010 Harwit ............. H01L 27/14806
  250/208.1
8,642,939 B2 * 2/2014 Yoshihara ......... H01L 27/14618
  250/208.1

(Continued)

FOREIGN PATENT DOCUMENTS

JP    06-244235 A     9/1994
JP    2004-281633 A   10/2004
(Continued)

OTHER PUBLICATIONS

International Search Report prepared by the Japan Patent Office dated May 26, 2015, for International Application No. PCT/JP2015/060924.

*Primary Examiner* — Thao P Le
(74) *Attorney, Agent, or Firm* — Sheridan Ross P.C.

(57) ABSTRACT

The present disclosure relates to a solid-state imaging device, a method for manufacturing the same, and an electronic device capable of increasing utilization efficiency of a substrate. The solid-state imaging device includes a first semiconductor substrate provided with a sensor circuit having a photoelectric conversion part, and a second semiconductor substrate and a third semiconductor substrate provided with respective circuits different from the sensor circuit. The first semiconductor substrate, the second semiconductor substrate, and the third semiconductor substrate are stacked on each other in three layers, and a metal element for an electrode constituting an electrode for external connection is disposed in the first semiconductor substrate. An electrode for a measuring terminal is disposed within the second semiconductor substrate or the third semiconductor substrate, and the first semiconductor substrate is stacked after performing a predetermined measurement. The present technology can be applied to a backside-illuminated solid-state imaging device, for example.

20 Claims, 20 Drawing Sheets

(52) U.S. Cl.
CPC .. *H01L 27/14632* (2013.01); *H01L 27/14634* (2013.01); *H01L 27/14636* (2013.01); *H01L 27/14643* (2013.01); *H01L 25/50* (2013.01); *H01L 2924/0002* (2013.01)

(56) References Cited

U.S. PATENT DOCUMENTS

| | | | | |
|---|---|---|---|---|
| 2006/0049362 | A1* | 3/2006 | Friedman | C22C 19/05 |
| | | | | 250/374 |
| 2011/0309261 | A1* | 12/2011 | Friedman | G01T 1/185 |
| | | | | 250/382 |
| 2013/0240748 | A1* | 9/2013 | Friedman | G01T 1/185 |
| | | | | 250/375 |
| 2014/0240836 | A1* | 8/2014 | Shinto | G02B 26/001 |
| | | | | 359/578 |
| 2015/0270307 | A1* | 9/2015 | Umebayashi | H01L 27/14623 |
| | | | | 257/292 |
| 2017/0148839 | A1* | 5/2017 | Umebayashi | H01L 27/14645 |
| 2017/0263666 | A1* | 9/2017 | Fujii | H01L 27/14636 |

FOREIGN PATENT DOCUMENTS

| | | |
|---|---|---|
| JP | 2013-201188 A | 10/2013 |
| JP | 2013-219319 A | 10/2013 |
| WO | WO 2001/063661 A1 | 8/2001 |

* cited by examiner

FIG. 8

|  | ALUMINUM PAD AT SURFACE SIDE OF SECOND LAYER | ALUMINUM PAD IN THIRD LAYER | ALUMINUM PAD AT REAR SIDE OF SECOND LAYER |
|---|---|---|---|
| INDEPENDENT SUBSTRATE OF SECOND LAYER | ○ | × | ○ |
| INDEPENDENT SUBSTRATE OF THIRD LAYER | × | ○ | ○ |
| COMMONLY USED IN SUBSTRATES OF SECOND LAYER AND THIRD LAYER | × | × | ○ |

FIG. 11
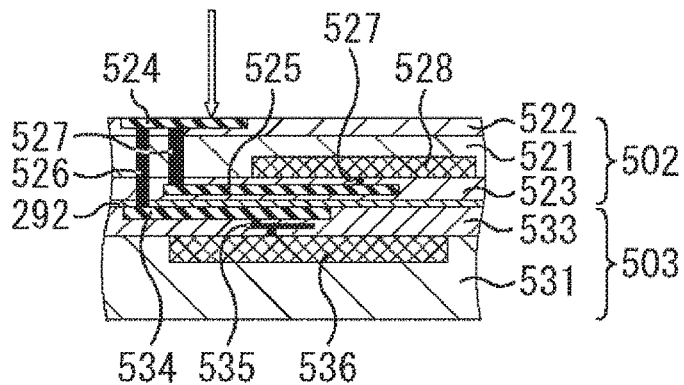
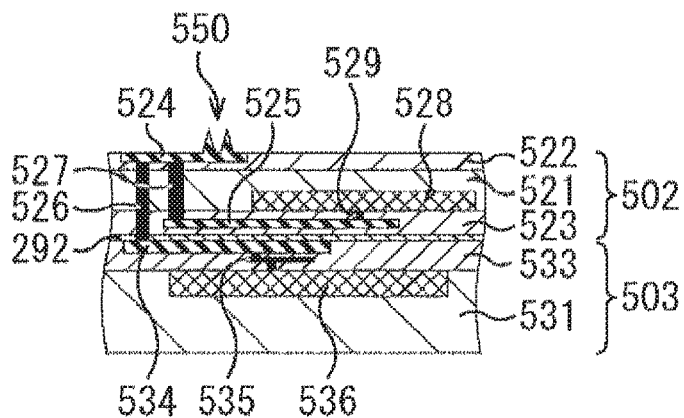
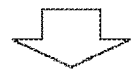
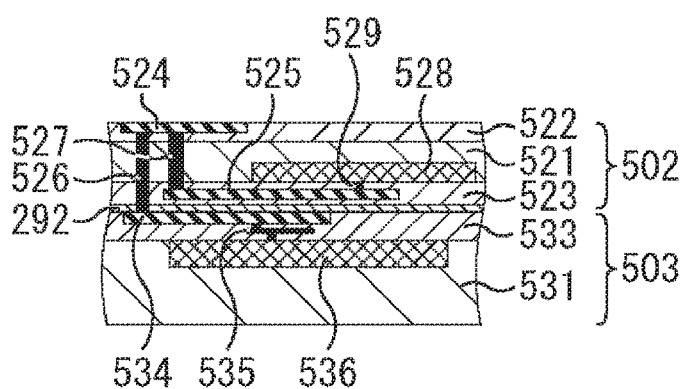

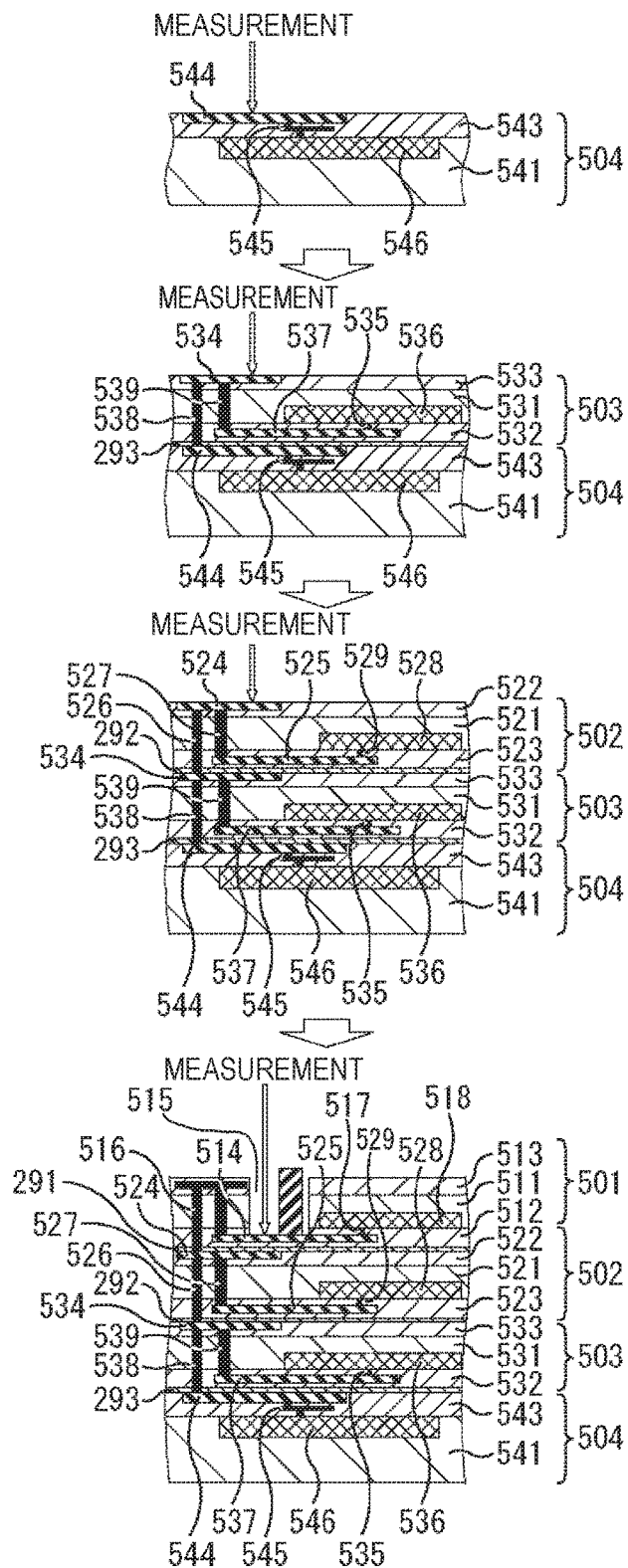

FIG. 13

| | ALUMINUM PAD AT SURFACE SIDE OF SECOND LAYER | ALUMINUM PAD AT SURFACE SIDE OF THIRD LAYER | ALUMINUM PAD IN FOURTH LAYER | ALUMINUM PAD AT REAR SURFACE SIDE OF SECOND LAYER | ALUMINUM PAD AT REAR SURFACE SIDE OF THIRD LAYER |
|---|---|---|---|---|---|
| INDEPENDENT SUBSTRATE OF SECOND LAYER | ○ | × | × | ○ | × |
| INDEPENDENT SUBSTRATE OF THIRD LAYER | × | ○ | × | ○ | ○ |
| INDEPENDENT SUBSTRATE OF FOURTH LAYER | × | × | ○ | ○ | ○ |
| COMMONLY USED IN SUBSTRATES OF SECOND LAYER AND THIRD LAYER | × | × | × | ○ | × |
| COMMONLY USED IN SUBSTRATES OF THIRD LAYER AND FOURTH LAYER | × | × | × | ○ | ○ |
| COMMONLY USED IN SUBSTRATES OF SECOND LAYER AND FOURTH LAYER | × | × | × | ○ | × |
| COMMONLY USED IN SUBSTRATES OF SECOND LAYER, THIRD LAYER, AND FOURTH LAYER | × | × | × | ○ | × |

SOLID-STATE IMAGING DEVICE, METHOD FOR MANUFACTURING SAME, AND ELECTRONIC DEVICE

CROSS REFERENCE TO RELATED APPLICATIONS

This application is a national stage application under 35 U.S.C. 371 and claims the benefit of PCT Application No PCT/JP2015/060924 having an international filing date of 8 Apr. 2015, which designated the United States, which PCT application claimed the benefit of Japanese Patent Application No. 2014-086424 file 18 Apr. 2014, the disclosures of which are incorporated herein by reference in their entirety.

TECHNICAL FIELD

The present disclosure relates to a solid-state imaging device, a method for manufacturing the same, and an electronic device, and particular to a solid-state imaging device, a method for manufacturing the same, and an electronic device capable of increasing utilization efficiency of a substrate.

BACKGROUND ART

In the related art, amplification type solid-state imaging devices represented by metal oxide semiconductor (MOS) type image sensors such as complementary metal oxide semiconductors (CMOSs) are known as solid-state imaging devices. Also, charge transfer type solid-state imaging devices represented by charge coupled device (CCD) image sensors are known.

Solid-state imaging devices have been widely used for digital still cameras, digital video cameras, or the like. In recent years, MOS type image sensors have been used as solid-state imaging devices mounted on mobile devices such as mobile phones with cameras, personal digital assistants (PDAs), and the like in many cases due to a low power voltage, a viewpoint of power consumption, or the like.

An MOS type solid-state imaging device is formed by a photodiode (PD) in which a unit pixel is a photoelectric conversion part and a plurality of pixel transistors, and is constituted by a pixel array (a pixel region) in which the plurality of unit pixels are arranged two-dimensionally and a peripheral circuit region. The plurality of pixel transistors are formed by MOS transistors and are constituted by 3 transistors which have a transfer transistor, a reset transistor, and an amplifier and transistor or 4 transistors in which a selection transistor is added to the 3 transistors.

Also, in the above-described solid-state imaging device, a stacked structure in which a plurality of semiconductor chips having different functions overlap each other to be electrically connected to each other has also been proposed.

Since circuits can be optimally formed to correspond to functions of semiconductor chips in a stacked structure, a high functionality of a device can be easily realized.

For example, a sensor circuit and a logic circuit are optimally formed to correspond to functions of a semiconductor chip provided with a sensor circuit and a semiconductor chip provided with a logic circuit in which a circuit configured to process a signal is provided so that a high-performance solid-state imaging device can be manufactured. In this case, through electrodes are provided in substrates of the semiconductor chips to electrically connect a plurality of semiconductor chips to each other.

However, when a semiconductor device is constituted by connecting heterogeneous chips to each other using a connecting conductor which passes through a substrate, a connecting hole has to be opened while securing insulation of a deep substrate. Thus, practical usage is difficult due to a cost economy of a manufacturing process necessary for processing a connecting hole and embedding a connecting conductor.

On the other hand, it is necessary to thin an upper chip to an utmost limit to form, for example, a small contact hole of about 1 µm. In this case, a complicated step such as bonding the upper chip to a supporting substrate before the thinning or the like is necessary, and a manufacturing cost is increased. In addition, since it is necessary to use a chemical vapor deposition (CVD) film having good coatability such as tungsten (W) as a connecting conductor to embed the connecting conductor in a connecting hole of a high aspect ratio, a material of the connecting conductor is limited.

Thus, a method of manufacturing a semiconductor device such as a solid-state imaging device in which each performance is sufficiently secured, high performance is attained, and mass production and cost reduction are attained (for example, refer to Patent Literature 1).

In Patent Literature 1, realization of a stacked structure by stacking a supporting substrate of a rear surface type image sensor as a logic circuit and providing a plurality of connecting contacts from an upper portion using a step of thinning the image sensor is proposed.

However, in recent years, a three-layer-stacked solid-state imaging device has also been proposed. When a stacked image sensor is constituted as a three-layer-stacked structure, it is necessary for a sensor having a light-receiving part to capture light. Thus, since the sensor is disposed at an uppermost portion, two chips are stacked as lower layers thereof. In this case, for example, a logic chip, a memory chip, or the like can be used as the two chips serving as the lower layers.

Generally, it is desirable that a supporting substrate is not used to thin a silicon substrate when a circuit is stacked. In this case, in producing a circuit, circuit surfaces of two chips serving as lower layers are first bonded to face each other, and a chip of a second layer is thinned. After that, a sensor of an uppermost layer is bonded and stacked as a rear surface type, and the chip is further thinned.

Accordingly, however, the following problem occurs in a three-layer-stacked structure. In other words, a pad opening to a pad metal unnecessarily becomes too deep. In other words, since an opening is provided up to an A1 layer of a chip of a second layer, the opening has to pass through a sensor of a chip of an uppermost layer, pass through a silicon substrate of the chip of the second layer, and reach the A1 layer in the lowermost layer of a wiring layer. Thickening a resist as well as curing a resist after dry etching is a problem in opening a deep pad.

For example, since an organic lens is already formed on a chip at a time of opening, a resist has to be removed using a chemical solution. However, the cured resist easily remains on a residue and thus inhibits incident light on the lens. Deposits generated due to dry etching are also a problem. In particular, deposits, which adhere to and are not removed from a metal surface of a pad and sidewalls of a pad opening, generate fluorine ions by absorbing moisture after a chip is completed and cause a failure in which a metal of a pad is melted (corroded). As described above, a process becomes difficult due to a deeper pad.

Also, in a pad opening region in a second layer or a subsequent layer, it has so far been necessary to form a through opening in a stacked product. Thus, a wiring or a circuit element cannot be disposed and a lot of dead space is generated. A measuring task for an evaluation item in which an upper substrate is not originally necessary has to be performed after all stackings have been completed, and a task such as discarding a defective wafer or redundancy repair is performed on a completely stacked product. Therefore, a defect rate is increased or a measurement time is increased.

CITATION LIST

Patent Literature

Patent Literature 1: JP 2010-245506A

SUMMARY OF INVENTION

Technical Problem

As described above, in the related art, in a three-layer-stacked solid-state imaging device, since it is generally necessary to form an opening, a wiring or a circuit element cannot be disposed and a lot of dead space is generated. Thus, it is necessary to effectively use a region regarded as dead space and to increase utilization efficiency of a substrate.

The present disclosure was made in terms of such circumstances, and an object of the present disclosure is directed toward increasing utilization efficiency of a substrate.

Solution to Problem

According to an aspect of the present disclosure, there is provided a solid-state imaging device including a first semiconductor substrate provided with a sensor circuit having a photoelectric conversion part, and a second semiconductor substrate and a third semiconductor substrate provided with respective circuits different from the sensor circuit. The first semiconductor substrate serves as an uppermost layer, and the first semiconductor substrate, the second semiconductor substrate, and the third semiconductor substrate are stacked on each other in three layers, a metal element for an electrode constituting an electrode for external connection is disposed in the first semiconductor substrate, and a metal element for an electrode constituting an electrode for a measuring terminal is disposed within the second semiconductor substrate or the third semiconductor substrate, and the first semiconductor substrate is stacked after performing a predetermined measurement.

According to an aspect of the present disclosure, there is provided a method for manufacturing a solid-state imaging device which includes a first semiconductor substrate provided with a sensor circuit having a photoelectric conversion part and a second semiconductor substrate and a third semiconductor substrate provided with respective circuits different from the sensor circuit, the method including the steps of serving the first semiconductor substrate as an uppermost layer, and stacking the first semiconductor substrate, the second semiconductor substrate, and the third semiconductor substrate on each other in three layers, disposing a metal element for an electrode constituting an electrode for external connection in the first semiconductor substrate, and disposing a metal element for an electrode constituting an electrode for a measuring terminal within the second semiconductor substrate or the third semiconductor substrate, and stacking the first semiconductor substrate after performing a predetermined measurement.

According to an aspect of the present disclosure, there is provided an electronic device including a solid-state imaging device which includes a first semiconductor substrate provided with a sensor circuit having a photoelectric conversion part, and a second semiconductor substrate and a third semiconductor substrate provided with respective circuits different from the sensor circuit. The first semiconductor substrate serves as an uppermost layer, and the first semiconductor substrate, the second semiconductor substrate, and the third semiconductor substrate are stacked on each other in three layers, a metal element for an electrode constituting an electrode for external connection is disposed in the first semiconductor substrate, and a metal element for an electrode constituting an electrode for a measuring terminal is disposed within the second semiconductor substrate or the third semiconductor substrate, and the first semiconductor substrate is stacked after performing a predetermined measurement.

According to an aspect of the present disclosure, a solid-state imaging device includes a first semiconductor substrate provided with a sensor circuit having a photoelectric conversion part, and a second semiconductor substrate and a third semiconductor substrate provided with respective circuits different from the sensor circuit. The first semiconductor substrate serves as an uppermost layer, and the first semiconductor substrate, the second semiconductor substrate, and the third semiconductor substrate are stacked on each other in three layers, a metal element for an electrode constituting an electrode for external connection is disposed in the first semiconductor substrate, and a metal element for an electrode constituting an electrode for a measuring terminal is disposed within the second semiconductor substrate or the third semiconductor substrate, and the first semiconductor substrate is stacked after performing a predetermined measurement.

Advantageous Effects of Invention

According to an aspect of the present disclosure, utilization efficiency of a substrate can be increased.

BRIEF DESCRIPTION OF DRAWINGS

FIG. 8 is a view illustrating relationships between aluminum pads used for measurement and substrates to be measured.

FIG. 11 is a view for describing planarization of a probe mark.

FIG. 12 is a view for describing a method for manufacturing a solid-state imaging element of a four-layer-stacked structure.

FIG. 13 is a view illustrating relationships between aluminum pads used for measurement and substrate to be measured.

DESCRIPTION OF EMBODIMENT(S)

Hereinafter, embodiments of a technique disclosed herein will be described with reference to the appended drawings.

First, problems in the related art will be described.

As described above, a solid-state imaging device of a stacked structure in which a plurality of semiconductor chips with different functions overlap each other and are electrically connected to each other has been proposed in the related art. In a solid-state imaging device of a stacked structure, circuits can be optimally formed to correspond to functions of semiconductor chips. Thus, a high functionality of the solid-state imaging device can be easily realized.

For example, a high-performance solid-state imaging device can be manufactured by optimally forming sensor circuits and logic circuits to correspond to functions of semiconductor chips having the sensor circuits and semiconductor chips having logic circuits provided with circuits configured to process signals. In this case, through electrodes are provided to substrates (a plurality of semiconductor substrates) of the semiconductor chips so that the semiconductor substrates are electrically connected to each other.

Figure 1:
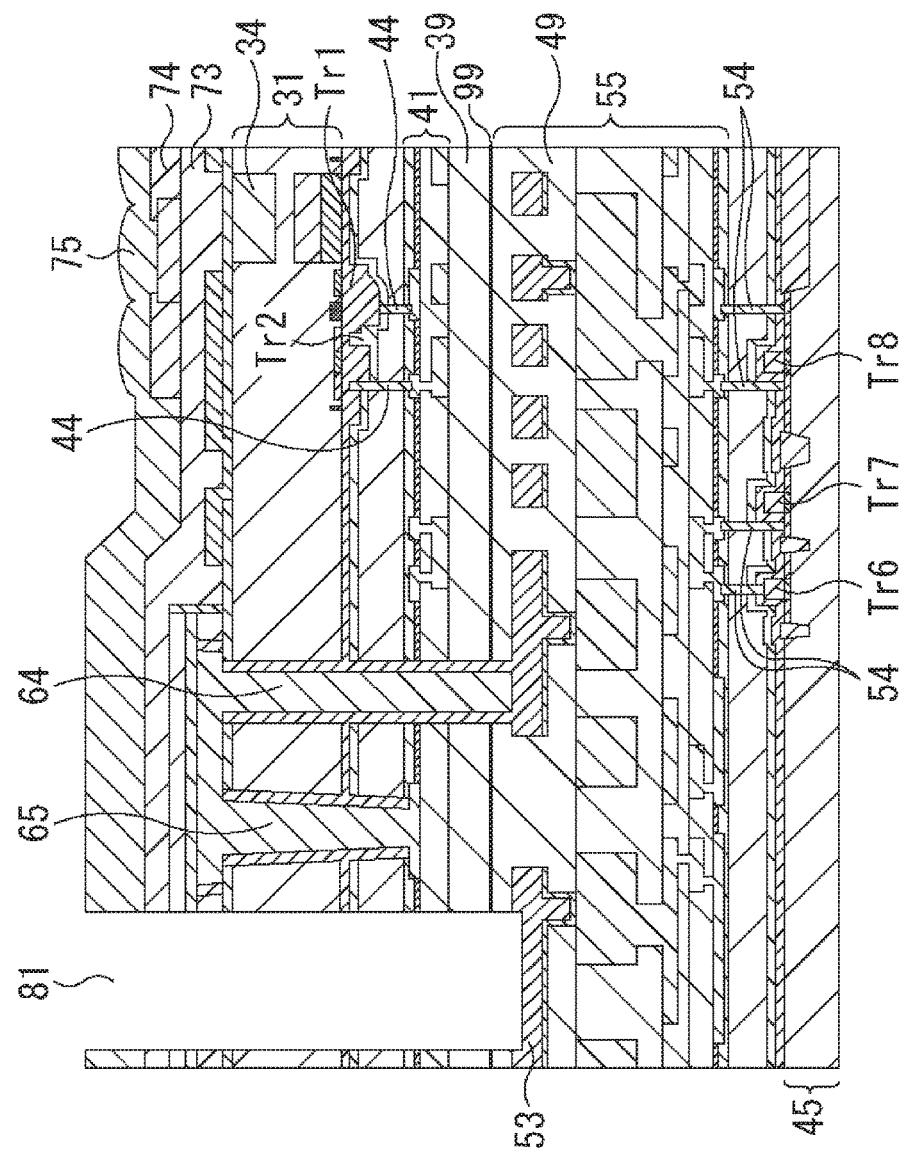
FIG. 1 is a cross-sectional view for describing a configuration of a pixel part of a stacked solid-state imaging device in the related art.

FIG. 1 is a cross-sectional view for describing a configuration of a pixel part of a stacked solid-state imaging device in the related art.

A solid-state imaging device related to the pixel part is constituted as a backside-illuminated complementary metal oxide semiconductor (CMOS) image sensor constituted by stacking a first semiconductor substrate and a second semiconductor substrate on each other. In other words, the solid-state imaging device shown in FIG. 1 is set as a two-layer-stacked structure.

As shown in FIG. 1, an image sensor, that is, a pixel array (hereinafter referred to as a pixel region) and a control region, is formed in each region of a first semiconductor substrate 31. In other words, a photodiode (PD) 34 serving as a photoelectric conversion part of each pixel is formed in each region of the semiconductor substrate (for example, a silicon substrate) 31, and a source/drain region of a pixel transistor is formed in each semiconductor well region.

Gate electrodes are each formed on a surface (an element forming surface) of a substrate in which pixels are each formed via gate insulating films, and a pixel transistor Tr1 and a pixel transistor Tr2 are formed by the gate electrodes and source/drain regions paired with the gate electrodes. The pixel transistor Tr1 near the PD 34 corresponds to a transfer transistor, and the source/drain region of the pixel transistor Tr1 corresponds to a floating diffusion (FD).

Subsequently, an inter-layer insulating film 39 of a first layer is formed on a surface of the first semiconductor substrate 31, connecting holes are formed in the inter-layer insulating film 39, and connecting conductors 44 to be connected to necessary transistors are formed. Subsequently, a multi-layer wiring layer 41 is formed by a plurality of layers (two layers in this example) of metal wirings via the inter-layer insulating film 39 to be connected to the connecting conductors 44. The metal wirings are formed by copper (Cu) wirings. In general, Cu wirings (metal wirings) are each covered with barrier metal films which prevent Cu diffusion. For this reason, a protective film serving as a cap film of the Cu wiring is formed on the multi-layer wiring layer 41.

Through the above-described processes, the first semiconductor substrate 31 in a semi-completed product state having the pixel region and the control region is formed.

On the other hand, for example, a logic circuit having a signal processing circuit related to a signal process of controlling a pixel region or controlling communication with the outside is formed in each region of a second semiconductor substrate 45. In other words, a plurality of metal oxide semiconductor (MOS) transistors Tr6, Tr7, and Tr8 which constitute the logic circuit to be isolated by element isolating regions are formed in p-type semiconductor well regions of a surface side of the semiconductor substrate (for example, a silicon substrate) 45.

Subsequently, an inter-layer insulating film 49 of the first layer is formed on a surface of the second semiconductor substrate 45, connecting holes are formed in the inter-layer insulating film 49, and connecting conductors 54 to be connected to necessary transistors are formed. Subsequently, a multi-layer wiring layer 55 is formed by forming a plurality of layers (four layers in this example) of metal wirings via the inter-layer insulating film 49 to be connected to the connecting conductors 54. The metal wirings are each formed using Cu wiring. A protective film serving as a cap film of the Cu wiring (the metal wiring) is formed on the multi-layer wiring layer 55. Here, an uppermost layer of the multi-layer wiring layer 55 is formed by an aluminum pad serving as an electrode.

Through the above-described processes, the second semiconductor substrate 45 having the logic circuit is formed.

Also, the first semiconductor substrate 31 and the second semiconductor substrate 45 are bonded at a bonding surface 99 such that the multi-layer wiring layer 41 and the multi-layer wiring layer 55 face each other. An example of the bonding includes plasma bonding and bonding using an adhesive. In addition, the first semiconductor substrate 31 is thinned by grinding/polishing the first semiconductor substrate 31 from a rear surface side thereof (a surface facing an upper side in FIG. 1), and the rear surface of the first semiconductor substrate 31 is thus set as a light incident surface when the first semiconductor substrate 31 is constituted as a backside-illuminated solid-state imaging device.

Connecting holes that pass through the first semiconductor substrate 31 from the rear surface side and reach the aluminum pad of the uppermost layer of the multi-layer wiring layer 55 of the second semiconductor substrate 45 are each formed at necessary positions of the thinned first semiconductor substrate 31. Simultaneously, connecting holes which reach the wirings of the first layer of the first semiconductor substrate 31 side from the rear surface side thereof are each formed in the first semiconductor substrate 31 to be adjacent to through connecting holes.

Subsequently, a through connecting conductor 64 and a connecting conductor 65 are embedded inside the through connecting holes Metals such as copper (Cu) and tungsten (WI) can be used as the through connecting conductor 64 and the connecting conductor 65.

As described above, since the logic circuit which executes the signal process or the like is formed in the second semiconductor substrate 45, it is necessary to exchange signals by connecting electrodes and signal lines of the transistors. In other words, the logic circuit operates in accordance with signals exchanged with the outside. Therefore, an aluminum pad 53 of the second semiconductor substrate 45 is an electrode for external connection.

For this reason, a pad hole 81 which passes through the first semiconductor substrate 31 is formed so that wire bonding can be performed on the aluminum pad 53 of the second semiconductor substrate, and the aluminum pad 53 is thus exposed. After that, a planarized film 73 is formed, for example, on-chip color filters 74 of red (R), green (G), and blue (B) are formed on the planarized film 73 to correspond to pixels, and on-chip micro-lenses 75 are formed on the on-chip color filters 74. Also, the pad hole 81 is formed in the first semiconductor substrate 31 such that the pad hole 81 reaches the aluminum pad 53 serving as an electrode used for transmission, reception, or the like of signals with an external device, an external circuit, or the like from the rear surface side (a light-receiving surface side) of the first semiconductor substrate 31.

Thus, a process of a stacked semiconductor structure is completed.

Next, chips of the backside-illuminated solid-state imaging device can be acquired by dividing the semiconductor chips into the chips.

On the other hand, in recent years, a three-layer-stacked solid-state imaging device has also been developed. A three-layer-stacked solid-state imaging device is constituted by, for example, a third semiconductor substrate in which a memory circuit is formed in addition to a first semiconductor substrate in which a pixel region and a control region (hereinafter also referred to as a sensor circuit) are formed and a second semiconductor substrate in which a logic circuit is formed.

Figure 2:
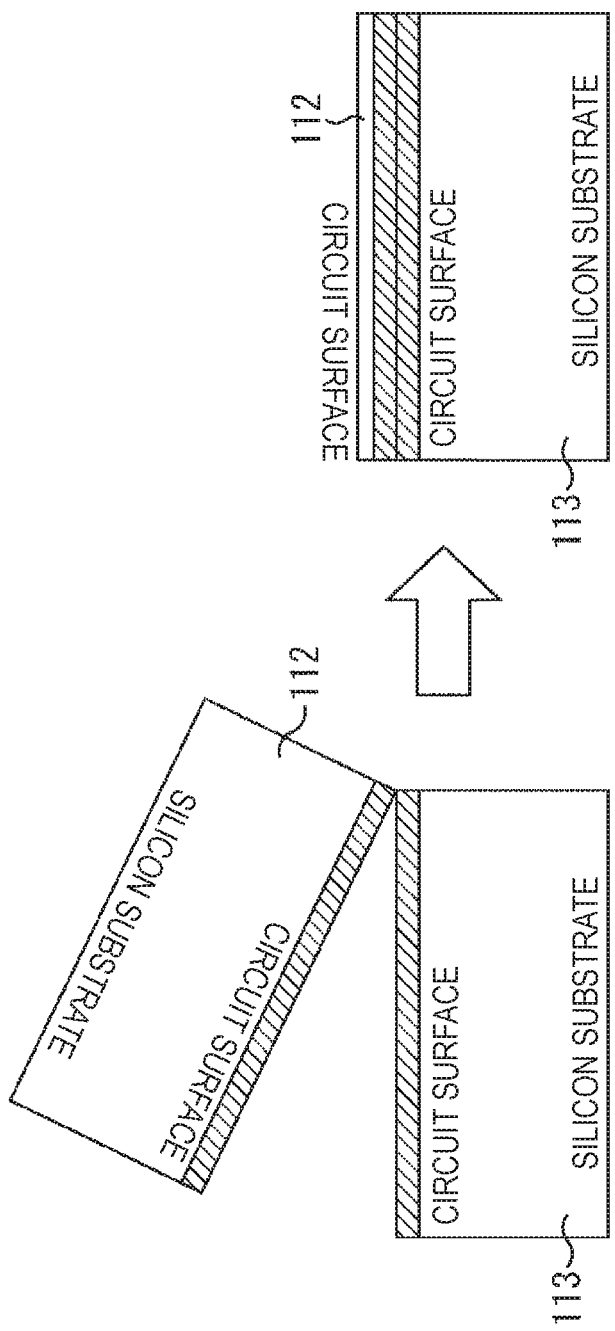
FIG. 2 is a view for describing a method for manufacturing a three-layer-stacked solid-state imaging device.
Figure 3:
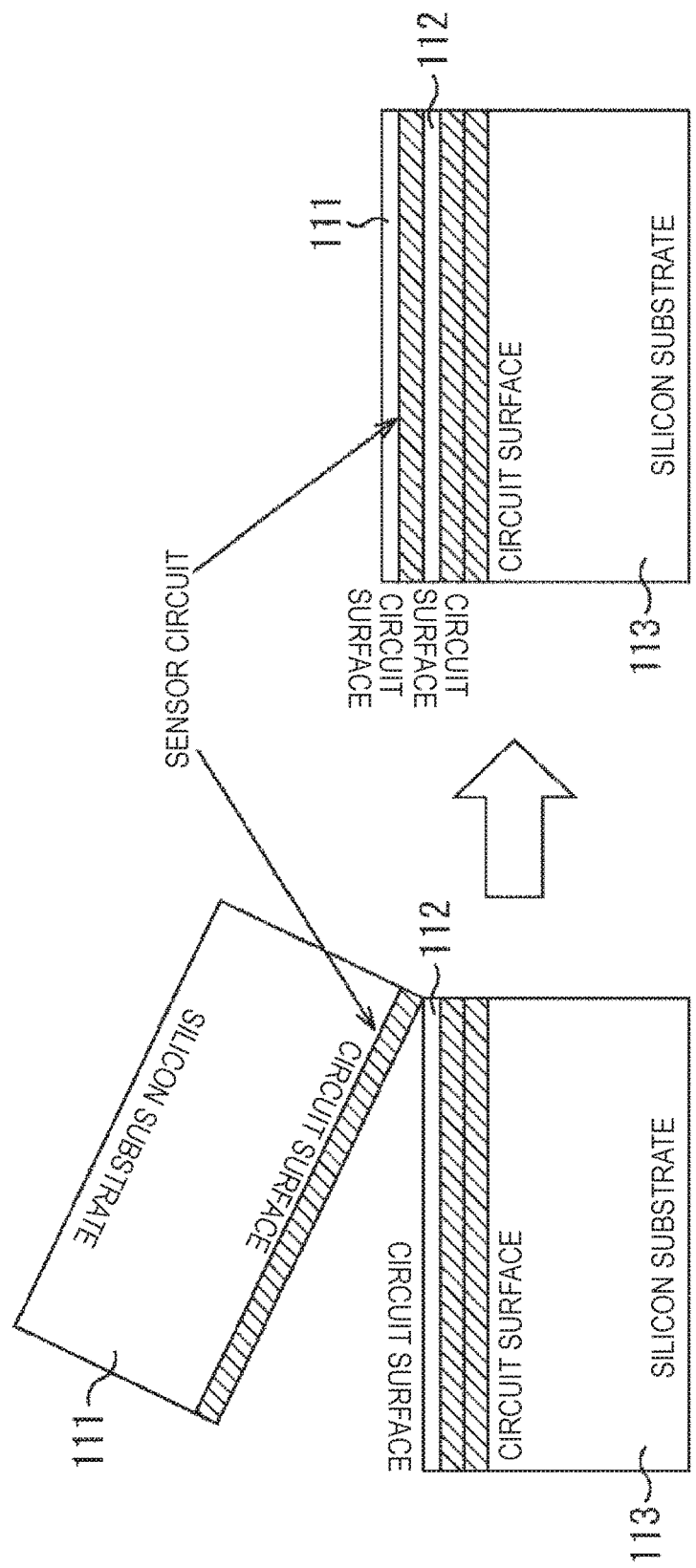
FIG. 3 is a view for describing a method for manufacturing a three-layer-stacked solid-state imaging device.

A three-layer-stacked solid-state imaging device is manufactured, for example, as shown in FIGS. 2 and 3.

As shown in FIG. 2, a second semiconductor substrate 112 and a third semiconductor substrate 113 are first bonded such that circuit surfaces thereof face each other. Note that interlayer films of the two semiconductor substrates are actually bonded. Also, the second semiconductor substrate 112 is thinned.

As shown in FIG. 3, after that, a first semiconductor substrate 111 is bonded on the thinned second semiconductor substrate 112 while a rear surface of the first semiconductor substrate 111 faces upward. Note that interlayer films of the two semiconductor substrates are actually bonded. Also, the first semiconductor substrate 111 is thinned.

As described above, when a stacked image sensor is constituted by a three-layer-stacked structure, it is necessary for a sensor circuit having a light-receiving part to capture light. Thus, the sensor circuit is disposed on an uppermost portion, and two lower layers, which are a logic circuit and a memory circuit, are stacked under the sensor circuit.

Also, when the circuits are stacked on each other, it is desirable to complete the stacking without using a supporting substrate used for thinning the silicon substrate. For this reason, when the circuits are produced, circuit surfaces of the two semiconductor substrates serving as the lower layers are first bonded to face each other, and the semiconductor substrate (the second semiconductor substrate 112) serving as the second layer is thinned. After that, the semiconductor substrate (the first semiconductor substrate 111) serving as the uppermost layer is stacked and bonded as a rear surface type, and is further thinned.

Accordingly, however, the following problem occurs in the three-layer-stacked structure.

Figure 4:
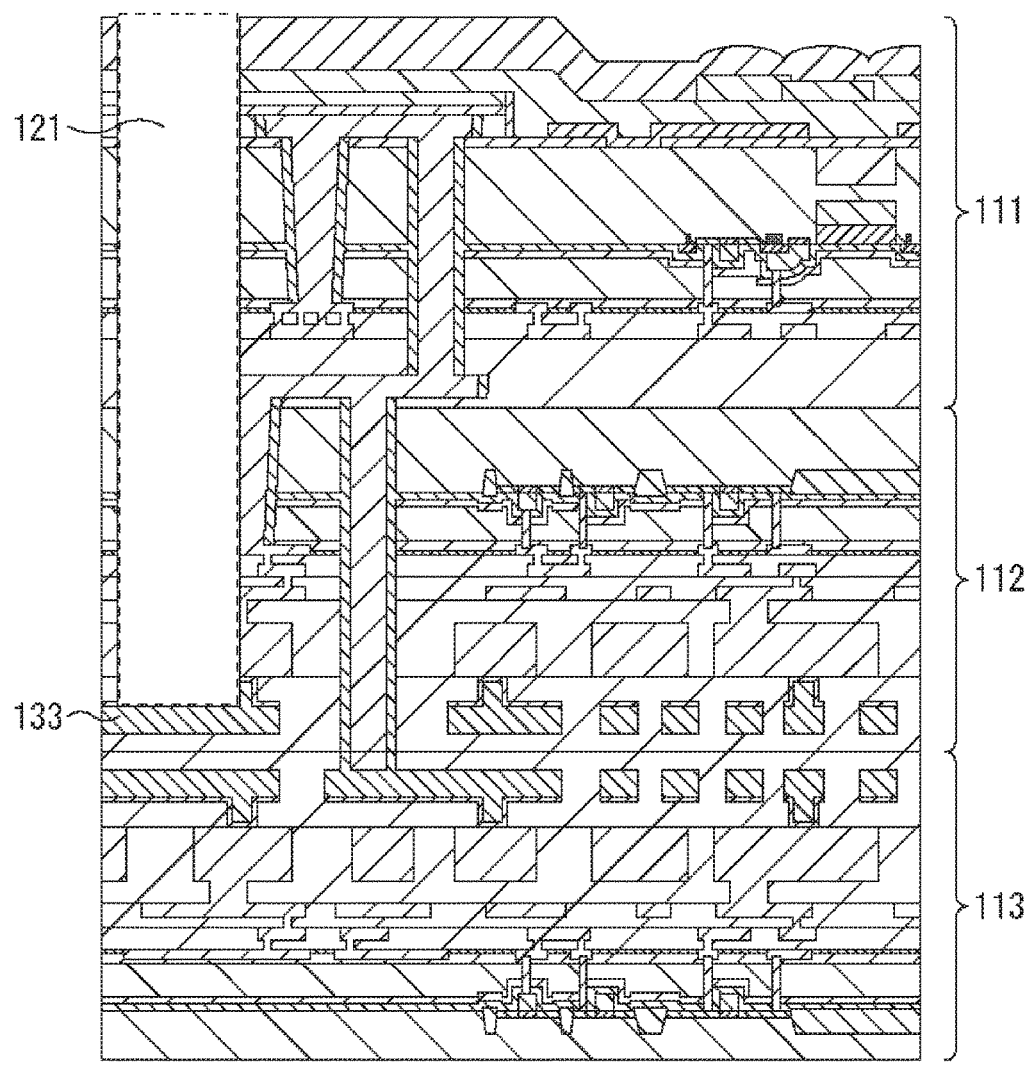
FIG. 4 is a cross-sectional view for describing a configuration of a pixel part of a solid-state imaging device of a three-layer-stacked structure manufactured by the related art.

FIG. 4 is a cross-sectional view for describing a configuration of a pixel part of a solid-state imaging device of a three-layer-stacked structure manufactured by the related art.

A first problem in the three-layer-stacked structure in the related art is a pad hole being too deep. In FIG. 4, a pad hole 121 that is deeper than the pad hole 81 of FIG. 1 is formed.

In other words, when a three-layer-stacked structure is provided, the circuit surface of the second semiconductor substrate 112 is bonded to face the circuit surface of the third semiconductor substrate as described above with reference to FIGS. 2 and 3. For this reason, an aluminum pad serving as an uppermost layer of a multi-layer wiring layer of the second semiconductor substrate is moved away from a light-receiving surface of the first semiconductor substrate 111, and thus an aluminum pad 133 (an electrode for external connection) of the second semiconductor substrate is not exposed as long as an opening is not formed to pass through the first semiconductor substrate and to substantially pass through the second semiconductor substrate.

It is necessary to thicken a resist to open the deep pad hole 121. When the resist is thickened to open the deep pad hole 121, curing the resist after dry etching is a problem. For example, since an on-chip micro-lens using an organic-based material is already formed on the first semiconductor substrate at a time of the opening, the resist has to be removed using a chemical solution. However, the cured resist easily remains on a residue and thus inhibits incident light on a lens.

Also, when the deep pad hole 121 is opened, deposits generated due to the dry etching are also a problem. In particular, deposits, which adhere to and are not removed from a surface of the aluminum pad 133 and sidewalls of the pad hole 121, generate fluorine ions by absorbing moisture, for example, after the three-layer-stacked structure is completed, and cause a failure in which a metal of the aluminum pad is melted (corroded).

As described above, in the related art, a process of manufacturing a solid-state imaging device becomes difficult due to a deep pad hole.

Figure 5:
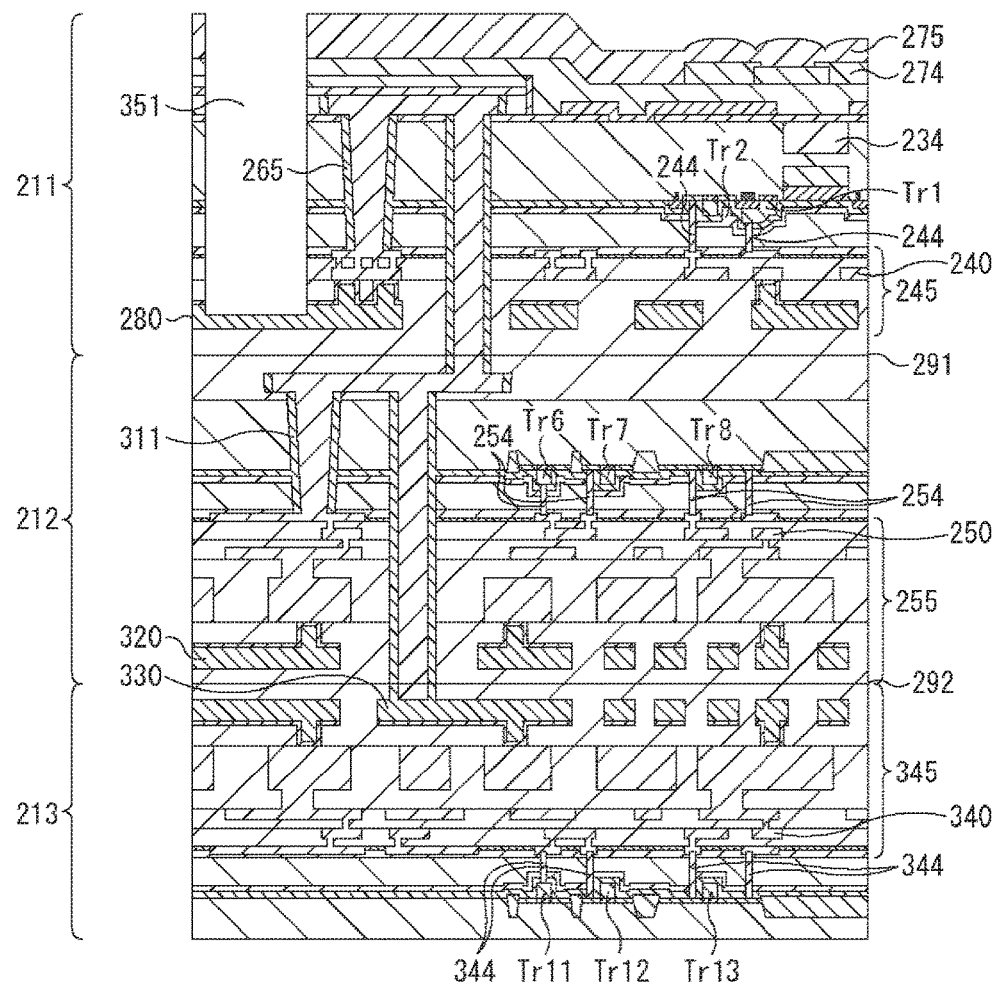
FIG. 5 is a cross-sectional view for describing a configuration related to an embodiment of a pixel part of a solid-state imaging device to which the present technique is applied.

FIG. 5 is a cross-sectional view for describing a configuration related to an embodiment of a pixel part of a solid-state imaging device to which the present technique is applied. The solid-state imaging device related to the pixel part is constituted as a backside-illuminated CMOS image sensor constituted by stacking a first semiconductor substrate, a second semiconductor substrate, and a third semiconductor substrate on each other. In other words, the solid-state imaging device related to the pixel part shown in FIG. 5 is set as a three-layer-stacked structure.

Also, the solid-state imaging device is constituted by, for example, a third semiconductor substrate in which a memory circuit is formed in addition to a first semiconductor substrate in which a sensor circuit is formed and a second semiconductor substrate in which a logic circuit is formed. The logic circuit and the memory circuit operate in accordance with signals exchanged with the outside.

In the embodiment, the second semiconductor substrate is described as the logic circuit and the third semiconductor substrate is described as the memory circuit, but chips having the same functions as the above-described case can be realized even in a case in which the second semiconductor is described as the memory circuit and the third semiconductor substrate is described as the logic circuit.

As shown in FIG. 5, a PD 234 serving as a photoelectric conversion part of a pixel is formed in a first semiconductor substrate (for example, a silicon substrate) 211, and a source/drain region of a pixel transistor is formed in each semiconductor well region.

Gate electrodes are each formed on a surface of a substrate in which pixels are each formed via gate insulating films, and a pixel transistor Tr1 and a pixel transistor Tr2 are formed by the gate electrodes and source/drain regions paired with the gate electrodes. The pixel transistor Tr1 near the PD 234 corresponds to a transfer transistor, and the source/drain region of the pixel transistor Tr1 corresponds to an FD.

An inter-layer insulating film is formed on the first semiconductor substrate 211, connecting holes are formed in the inter-layer insulating film, and connecting conductors 244 to be connected to the pixel transistor Tr1 and the pixel transistor Tr2 are formed. A multi-layer wiring layer 245 is formed by forming a plurality of layers of metal wirings 240 to be connected to the connecting conductors 244. The Cu wirings 240 (metal wirings) are formed by copper (Cu) wirings. In general, Cu wirings are each covered with barrier metal films which prevent Cu diffusion. For this reason, a protective film serving as a cap film of the Cu wiring is formed on the multi-layer wiring layer 245.

An aluminum pad 280 serving as an electrode for external connection is formed on a lowermost layer of the multi-layer wiring layer 245 of the first semiconductor substrate 211. In other words, the aluminum pad 280 is formed at a position closer to a bonding surface 291 with a second semiconductor substrate 212 than the Cu wirings 240. The electrode for external connection is used as an end of a wiring related to exchanging signals with the outside. Note that the electrode is described to be formed by aluminum here, but the electrode may be formed by another metal.

A contact 265 used for electrical connection with the second semiconductor substrate 212 is formed in the first semiconductor substrate 211. The contact 265 is connected to a contact 311 of the second semiconductor substrate 212, which will be described below, and is also connected to the aluminum pad 280 of the first semiconductor substrate 211.

A pad hole 351 is formed in the first semiconductor substrate 211 to reach the aluminum pad 280 from a rear surface side (a light-receiving surface side) of the first semiconductor substrate 211.

Figure 6:
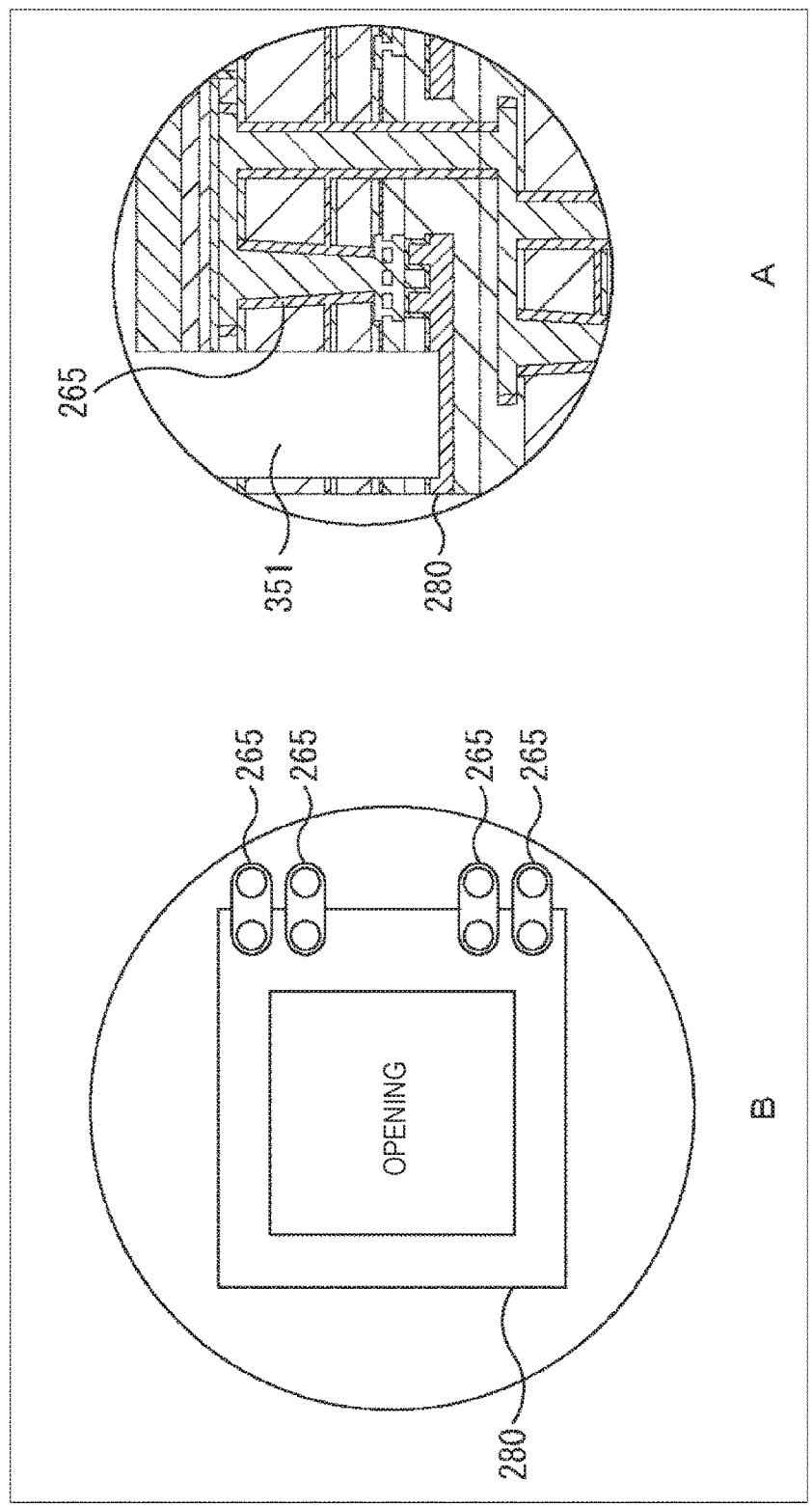
FIG. 6 is a view for describing a pad hole and an aluminum pad of FIG. 5.

FIG. 6 is a view for describing a configuration of the pad hole 351 and the aluminum pad 280. A of FIG. 6 is an enlarged view of a portion near the pad hole 351 and B of FIG. 6 is a view of the pad hole 351 of the aluminum pad 280 viewed from the above.

As shown in B of FIG. 6, a plurality of contacts 265 are arranged to be connected to an end of the aluminum pad 280 so that connection resistance can be reduced.

Referring again to FIG. 5, an insulating protective film is formed on an entire rear surface of the first semiconductor substrate 211, and a light shielding film is formed on a region to be shielded as in the case described above with reference to FIG. 1. Also, on-chip color filters 274 are formed on a planarized film to correspond to pixels, and on-chip microlenses 275 are formed on the on-chip color filters 274.

On the other hand, the second semiconductor substrate 212 is formed with a logic circuit. In other words, a MOS transistor Tr6, a MOS transistor Tr7, and a MOS transistor Tr8, which are a plurality of transistors constituting the logic circuit, are formed in p-type semiconductor well regions of the semiconductor substrate (for example, a silicon substrate) 212.

Also, in the second semiconductor substrate 212, connecting conductors 254 connected to the MOS transistor Tr6, the MOS transistor Tr7, and the MOS transistor Tr8 are formed. A multi-layer wiring layer 255 is formed by forming a plurality of layers of metal wiring 250 to be connected to the connecting conductors 254. The metal wirings are formed by copper (Cu) wirings. A protective film serving as a cap film of each of the Cu wirings (metal wirings) 250 is formed on the multi-layer wiring layer 255.

An aluminum pad 320 serving as an electrode is formed on a lowermost layer of the multi-layer wiring layer 255 of the second semiconductor substrate 212. In the second semiconductor substrate 212, the contact 311 used for electrical connection with the first semiconductor substrate 211 and the third semiconductor substrate 213 is established. The contact 311 is connected to the contact 265 of the first semiconductor substrate 211 and is also connected to an aluminum pad 330 of the third semiconductor substrate 213.

Also, the third semiconductor substrate 213 is formed with a memory circuit. In other words, a MOS transistor Tr11, a MOS transistor Tr12, and a MOS transistor Tr13, which are a plurality of transistors constituting the memory circuit, are formed in p-type semiconductor well regions of the semiconductor substrate (for example, a silicon substrate) 213.

Also, in the third semiconductor substrate 213, connecting conductors 344 connected to the MOS transistor Tr11, the MOS transistor Tr12, and the MOS transistor Tr13 are formed. A multi-layer wiring layer 345 is formed by forming a plurality of layers of metal wirings 340 to be connected to the connecting conductors 344. The metal wirings are formed by copper (Cu) wirings. A protective film serving as a cap film of each of the Cu wirings (metal wirings) 340 is formed on the multi-layer wiring layer 345. The aluminum pad 330 serving as an electrode is formed on an uppermost layer of the multi-layer wiring layer 345.

Since the contact 265 and the contact 311 are provided in the solid-state imaging device shown in FIG. 5, the first semiconductor substrate 211 to the third semiconductor substrate 213 can exchange signals with each other via the aluminum pad 280.

Even in the solid-state imaging device shown in FIG. 5, interlayer films of the second semiconductor substrate 212 and the third semiconductor substrate 213 are bonded at a bonding surface 292 as described above with reference to FIGS. 2 and 3. Interlayer films of the second semiconductor substrate 212 and the first semiconductor substrate 211 are bonded at the bonding surface 291.

In other words, circuit surfaces of the two semiconductor substrates serving as lower layers are first bonded to face each other, and the semiconductor substrate (the second semiconductor substrate 212) serving as the second layer is thinned as described above with reference to FIGS. 2 and 3. After that, the semiconductor substrate (the first semiconductor substrate 211) serving as the uppermost layer is stacked and bonded as a rear surface type, and is further thinned. In this case, after an upper layer of the contact 311 is planarized, the first semiconductor substrate 211 is bonded to the second semiconductor substrate 212 as a rear surface type.

Accordingly, when the circuits are stacked on each other, the stacking is completed to thin the silicon substrate without using a supporting substrate.

As described above, in the solid-state imaging device of the three-layer-stacked structure as shown in FIG. 5, since the pad hole 351 is formed only in the first semiconductor substrate 211, a region of a lower layer of the pad hole 351 can be effectively utilized so that utilization efficiency of the substrate can be increased compared to, for example, the solid-state imaging element of the three-layer-stacked structure in the related art shown in FIG. 4.

Next, a further increase of utilization efficiency of a substrate in a solid-state imaging element of a stacked structure will be described with reference to FIGS. 7 to 18. Note that, hereinafter, description is given using a solid-state imaging element shown as simplified compared to the configuration example of FIG. 5, and even if component elements correspond to each other in the solid-state imaging elements, the component elements are denoted by different reference numerals in some cases.

Figure 7:
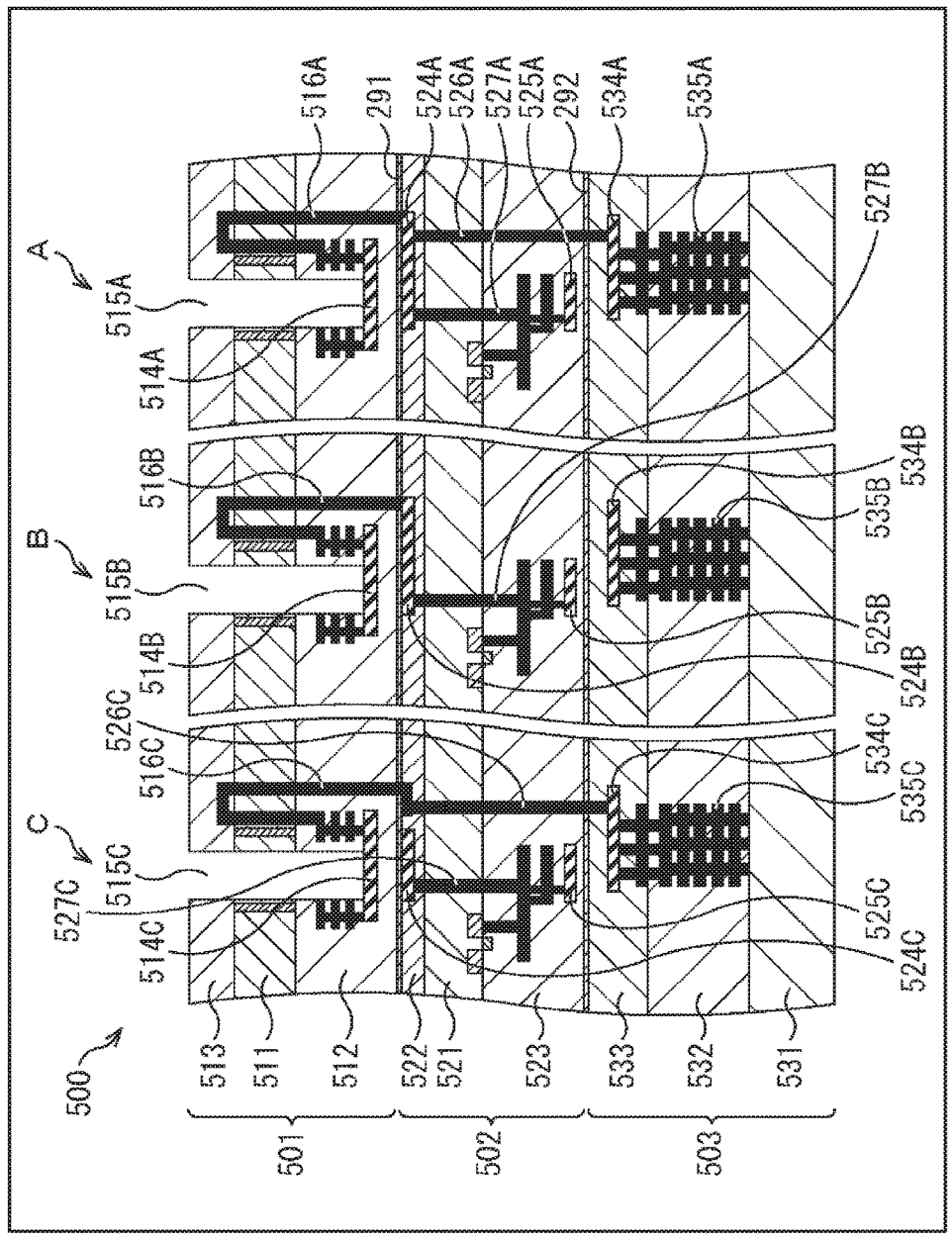
FIG. 7 is a view showing a connection configuration in a solid-state imaging element of a three-layer-stacked structure.

A solid-state imaging element 500 shown in FIG. 7 is constituted by a three-layer-stacked structure in which a substrate of a first layer 501, a substrate of a second layer 502, and a substrate of a third layer 503 are stacked on each other. Note that the substrate of the first layer 501, the substrate of the second layer 50 and the substrate of the third layer 503 correspond to, for example, the first semiconductor substrate 211, the second semiconductor substrate 212, and the third semiconductor substrate 213 of FIG. 5, respectively. In other words, in the solid-imaging element 500, the substrate of the first layer 501 is provided with a sensor circuit, the substrate of the second layer 502 is provided with a logic circuit, and the substrate of the third layer 503 is provided with a memory circuit.

The substrate of the first layer 501 is configured such that a wiring layer 512 is stacked on a surface (a surface facing a lower side of FIG. 7) side of a silicon substrate 511, and a planarized film 513 is stacked on a rear surface (a surface facing an upper side of FIG. 7) side of the silicon substrate 511. Also, in the substrate of the first layer 501, pad holes 515 are formed to pass through the substrate of the first layer 501 from a rear surface side to aluminum pads 514 formed in the wiring layer 512. Also, in the substrate of the first layer 501, contacts 516 which connect the aluminum pads 514 to at least one of the substrate of the second layer 502 and the substrate of the third layer 503 are formed. Note that the aluminum pads 514, the pad holes 515, and the contacts 516 correspond to, for example, the aluminum pad 280, the pad hole 351, and the contact 265 of FIG. 5, respectively.

The substrate of the second layer 502 is configured such that a wiring layer 522 is stacked at a rear surface a surface facing the upper side of FIG. 7) side of a silicon substrate 521, and a wiring layer 523 is stacked at a surface (a surface facing the lower side of FIG. 7) side of the silicon substrate 521. Also, in the substrate of the second layer 502, the wiring layer 522 is formed with aluminum pads 524 of the rear surface side, and the wiring layer 523 is formed with aluminum pads 525 of the surface side. Also, the substrate of the second layer 502 is formed with contacts 526 which connect the substrate of the first layer 501 and the substrate of the third layer 503. The substrate of the second layer 502 is formed with the aluminum pads 524 of the rear surface side, the aluminum pads 525 of the surface side, and contacts 527 which each connect transistors constituting the logic circuit provided in the substrate of the second layer 502. Note that the contacts 526 and the contacts 527 correspond to, for example, the contact 311 of FIG. 5.

The substrate of the third layer 503 is configured such that a wiring layer 532 is stacked at a surface (a surface facing the upper side of FIG. 7) side of a silicon substrate 531, and a wiring layer 533 is stacked on the wiring layer 532. Also, in the substrate of the third layer 503, the wiring layer 533 is formed with aluminum pads 534. In the substrate of the third layer 503, connecting conductors 535 which connects the aluminum pads 534 to the memory circuit provide in the substrate of the third layer 503 are formed in the wiring layer 532. Note that the aluminum pads 534 and the connecting conductors 535 correspond to, for example, the aluminum pad 330 and the connecting conductors 344 of FIG. 5, respectively.

The substrate of the first layer 501 and the substrate of the second layer 502 are attached to each other via the bonding surface 291, and the substrate of the second layer 502 and the substrate of the third layer 503 are attached to each other via the bonding surface 292 so that the solid-state imaging element 500 is constituted.

In the solid-state imaging element 500 constituted in this way, the aluminum pads 514 formed in the wiring layer 512 of the substrate of the first layer 501 serve as electrodes for external connection (metal elements). In the substrate of the second layer 502 having the logic circuit in which it is necessary to exchange signals with the outside, the aluminum pads 524 of the rear surface side and the aluminum pads 525 of the surface side which are used as electrodes for measuring terminals (metal elements) are provided instead of the electrodes for external connection. Similarly, in the substrate of the third layer 503 having the memory circuit, the aluminum pads 534 used as electrodes for measuring terminals (metal elements) are provided instead of the electrodes for external connection.

Here, in the solid-state imaging element 500, a plurality of connection configurations can be used as a connection configuration for the aluminum pads 514 serving as the electrodes for external connection. In other words, a connection configuration A, a connection configuration B, and a connection configuration C are illustrated as three connection configurations for the aluminum pads 514 in order from the right in FIG. 7.

For example, the connection configuration A is a configuration in which the substrate of the second layer 502 and the substrate of the third layer 503 are connected to an aluminum pad 514A serving as an electrode for external connection. In other words, in the connection configuration A, an electrical connection between the aluminum pad 514A and an aluminum pad 524A of the rear surface side is established by a contact 516A, and an electrical connection between the aluminum pad 524A of the rear surface side and an aluminum pad 534A is established by a contact 526A. The substrate of the first layer 501, the substrate of the second layer 502, and the substrate of the third layer 503 are connected to each other through such a connection configuration A, and connecting terminals having the same function when performing measurement before and after stacking can thus be formed.

The connection configuration B is a configuration in which the substrate of the second layer 502 is connected to the aluminum pad 514A serving as an electrode for external connection. In other words, in the connection configuration B, while an electrical connection between an aluminum pad 514B and an aluminum pad 524B of the rear surface side is established by a contact 516B, an electrical connection of an aluminum pad 534B to the outside is not established. The substrate of the first layer 501 and the substrate of the second layer 502 are connected to each other through such a connection configuration B, and electrodes for external connection and measurement having other independent functions when performing measurement before and after stacking can thus be formed in a stacked manner.

The connection configuration C is a configuration in which the substrate of the third layer 503 is connected to an aluminum pad 514C serving as an electrode for external connection. In other words, in the connection configuration C, while an electrical connection between the aluminum pad 514C and an aluminum pad 534C is established by contacts 516C and 526C, an electrical connection of an aluminum pad 524C of the rear surface side to the outside is not established. The substrate of the first layer 501 and the substrate of the third layer 503 are connected to each other through the connection configuration C, and electrodes for external connection and measurement having other independent functions when performing measurement before and after stacking can thus be formed in a stacked manner.

As described above, in the solid-state imaging element 500, functions of aluminum pads can be separately created by establishing connection configurations among the substrate of the first layer 501, the substrate of the second layer 502, and the substrate of the third layer 503 as different configurations such as the connection configuration A, the connection configuration B, and the connection configuration C. In other words, the aluminum pads 514 serving as electrodes for external connection, the aluminum pads 524 of the rear surface side and the aluminum pads 525 of the surface side serving as measuring electrodes, and the aluminum pads 534 serving as measuring electrodes are disposed in a mixed manner.

The aluminum pads 514 of the substrate of the first layer 501, the aluminum pads 524 of the rear surface side and the aluminum pads 525 of the surface side of the substrate of the second layer 502, and the aluminum pads 534 of the substrate of the third layer 503 are disposed at substantially the same position in a vertical direction (positions which overlap each other when viewed from a direction perpendicular to surfaces of the substrates).

The aluminum pads 524 of the rear surface side of the substrate of the second layer 502 are used for connection to the outside via the aluminum pads 514 of the substrate of the first layer 501, and are used for measuring a logic circuit from the rear surface side independently in the substrate of the second layer 502 like in the connection configurations A and B. For example, the aluminum pad 524C of the rear surface side in which an electrical connection to the outside is not established is used as an electrode terminal dedicated to measurement like in the connection configuration C. The aluminum pads 525 of the surface side of the substrate of the second layer 502 in which an electrical connection to the outside is not established are used as electrode terminals dedicated to measurement of a logic circuit from the rear surface side independently in the substrate of the second layer 502.

Similarly, the aluminum pads 534 of the substrate of the third layer 503 are used for connection to the outside via the aluminum pad 514 of the substrate of the first layer 501, and are used for measuring a memory circuit from the surface side independently in the substrate of the third layer 503 like in the connection configurations A and C. For example, the aluminum pad 534B in which an electrical connection to the outside is not established is used as an electrode terminal dedicated to measurement like the in connection configuration B.

The aluminum pad 524 of the rear surface side of the substrate of the second layer 502 can be used for measuring both of the logic circuit of the substrate of the second layer 502 and the memory circuit of the substrate of the third layer 503 as a stacked product in which the substrate of the second layer 502 and the substrate of the third layer 503 are stacked on each other.

FIG. 8 illustrates relationships between aluminum pads used for measurement and substrates to be measured.

In other words, the aluminum pads 525 of the surface side of the substrate of the second layer 502 can be used only for independent measurement in the substrate of the second layer 502 before the substrate of the second layer 502 and the substrate of the third layer 503 are bonded to each other. Similarly, the aluminum pad 534 of the substrate of the third layer 503 can be used only for independent measurement in the substrate of the third layer 503 before the substrate of the second layer 502 and the substrate of the third layer 503 are bonded to each other.

The aluminum pad 524 of the rear surface side of the substrate of the second layer 502 can be used for independent measurement in the substrate of the second layer 502, independent measurement in the substrate of the third layer 503, and measurement (evaluation) in a stacked product in which the substrate of the second layer 502 and the substrate of the third layer 503 are stacked as a single body. In other words, a functional aspect in which stacking can be evaluated is added to the aluminum pad 524 of the rear surface side of the substrate of the second layer 502.

Next, a method for manufacturing the solid-state imaging element 500 of a three-layer-stacked structure will be described with reference to FIG. 9.

First, in a first step, a circuit 536 formed in a substrate of the third layer 503 is measured using the aluminum pad 534 of the substrate of the third layer 503. In the substrate of the third layer 503, the circuit 536, such as a memory circuit, is formed in the silicon substrate 531, and the circuit 536 is connected to the aluminum pad 534 via the connecting conductor 535. Therefore, the circuit 536 can be independently measured by bringing a measuring probe into contact with the aluminum pad 534.

Subsequently, in a second step, a substrate of the second layer 502 is bonded to the substrate of the third layer 503 via the bonding surface 292. Also, a circuit 528 formed in the substrate of the second layer 502 and the circuit 536 formed in the substrate of the third layer 503 are measured using the aluminum pad 524 of a rear surface side of the substrate of the second layer 502.

In the substrate of the second layer 502, the circuit 528, such as a logic circuit, is formed in the silicon substrate 521, and the circuit 528 is connected to the aluminum pad 524 of the rear surface side via a connecting conductor 529 the aluminum pad 525 of a surface side, and the contact 527. Also, the aluminum pad 524 of the rear surface side is connected to the aluminum pad 534 via the contact 526. Therefore, for example, the independent circuit 528, the independent circuit 536, and the circuit 528 and the circuit 536 serving as a stacked product can be measured by bringing a measuring probe into contact with the aluminum pad 524 of the rear surface side.

After the measuring, in a third step, a substrate of the first layer 501 is bonded to the substrate of the second layer 502 via the bonding surface 291, and a wiring for connecting to the outside is connected to the aluminum pad 514. A circuit 518 formed in the substrate of the first layer 501, the circuit 528 formed in the substrate of the second layer 502, and the circuit 536 formed in the substrate of the third layer 503 are measured using the aluminum pad 514 of the substrate of the first layer 501.

In the substrate of the first layer 501, a circuit 518, such as a sensor circuit, is formed in the silicon substrate 511, and the circuit 518 is connected to the aluminum pad 514 via a connecting conductor 517. Also, the aluminum pad 514 is connected to the aluminum pad 524 of the rear surface side via the contact 516. Therefore, for example, the independent circuit 518, the independent circuit 528, and the independent circuit 536 can be measured by bringing a measuring probe into contact with the aluminum pad 514. The circuit 518 and the circuit 528 serving as a stacked product, the circuit 518 and the circuit 536 serving as a stacked product, and the circuit 518, the circuit 528, and the circuit 536 serving as a stacked product can be measured.

As described above, in the solid-state imaging element 500, since a circuit can be measured using an aluminum pad every time a substrate is stacked, it is not necessary to connect a circuit of a lower layer to an aluminum pad of an uppermost layer. Thus, for example, utilization efficiency of a substrate can be increased compared to a configuration in which a circuit is measured after all bases are stacked on each other.

Figure 9:
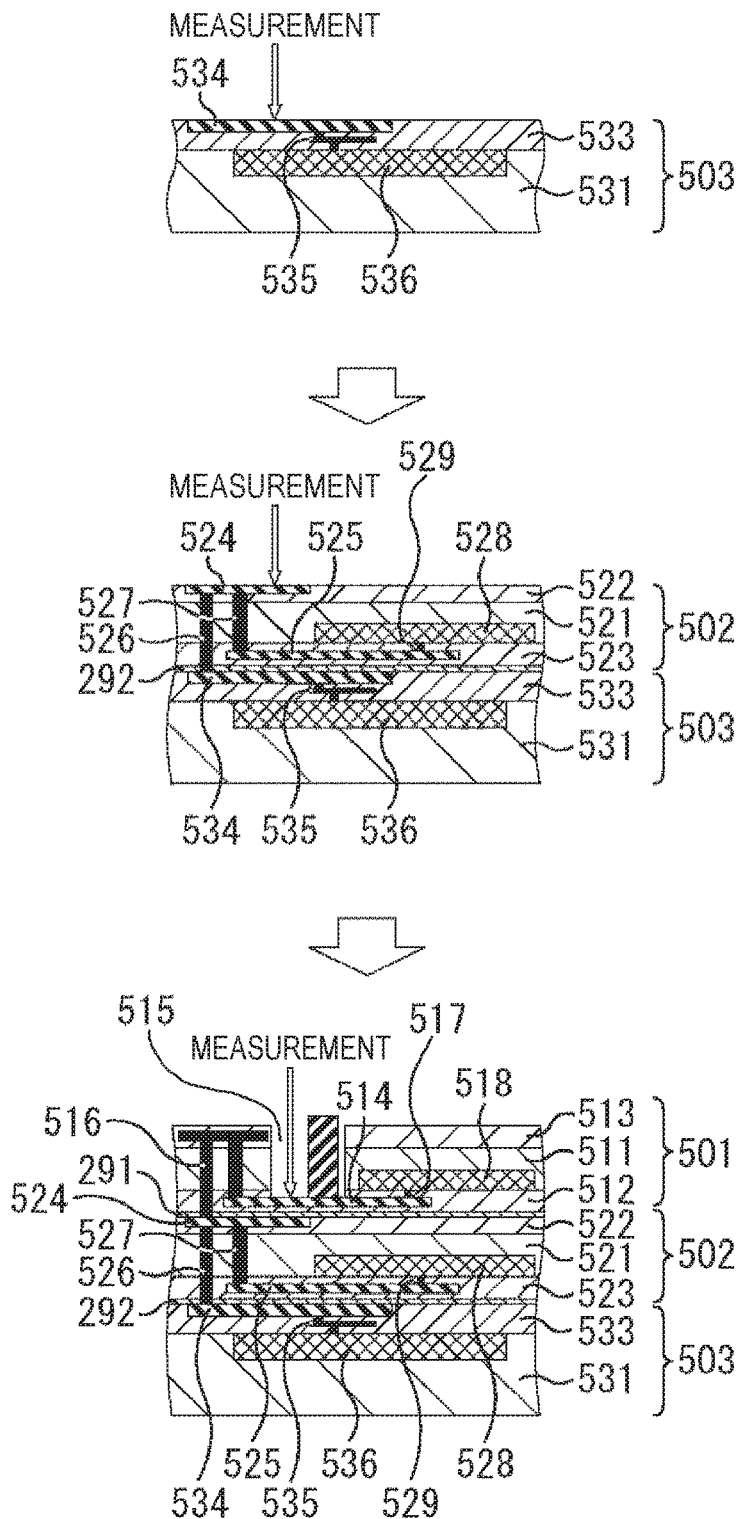
FIG. 9 is a view for describing a method for manufacturing a solid-state imaging element of a three-layer-stacked structure.

In the second step shown in FIG. 9, when there is a defective portion in the substrates up to the substrate of the second layer 502 When measurement is performed using the aluminum pad 524 of the rear surface side of the substrate of the second layer 502, a wafer (a stacked product) is selected in this step and can be discarded before the substrate of the first layer 501 is stacked thereon. Alternatively, when there is a defective portion in the substrates up to the substrate of the second layer 502, redundancy of the defective portion can be repaired. In other words, when the substrate of the first layer 501 is measured, if it is necessary to perform repairs by measuring the substrate of the second layer 502 (a logic circuit) and the substrate of the third layer 503 (a memory circuit) on which the substrate of the first layer 501 is stacked, this is because it is necessary to dispose a pad opening electrode necessary for measuring the substrate of the second layer 502 and the substrate of the third layer 503 within the substrate of the first layer 501.

Note that, when measurement is performed using the aluminum pad 524 of the rear surface side of the substrate of the second layer 502, a test circuit or a redundant circuit (a fuse portion) can be disposed in a substrate different from that of a circuit to be tested or a circuit on which redundant relief is performed in other words, a test circuit can be disposed in the substrate of the second layer 502, and a circuit to be tested can be disposed in the substrate of the third layer 503.

As described above, only a terminal necessary for measurement evaluation of an interface of the substrate of the first layer 501 itself and a product serves as the aluminum pad 514 formed in the substrate of the first layer 501 of the solid-state imaging element 500, and an electrode necessary for another measurement is built in the substrate of the second layer 502 or a subsequent layer. Thus, duplication of a pad electrode can be prevented, and thus it is possible to greatly contribute to a decrease in a chip area.

Figure 10:
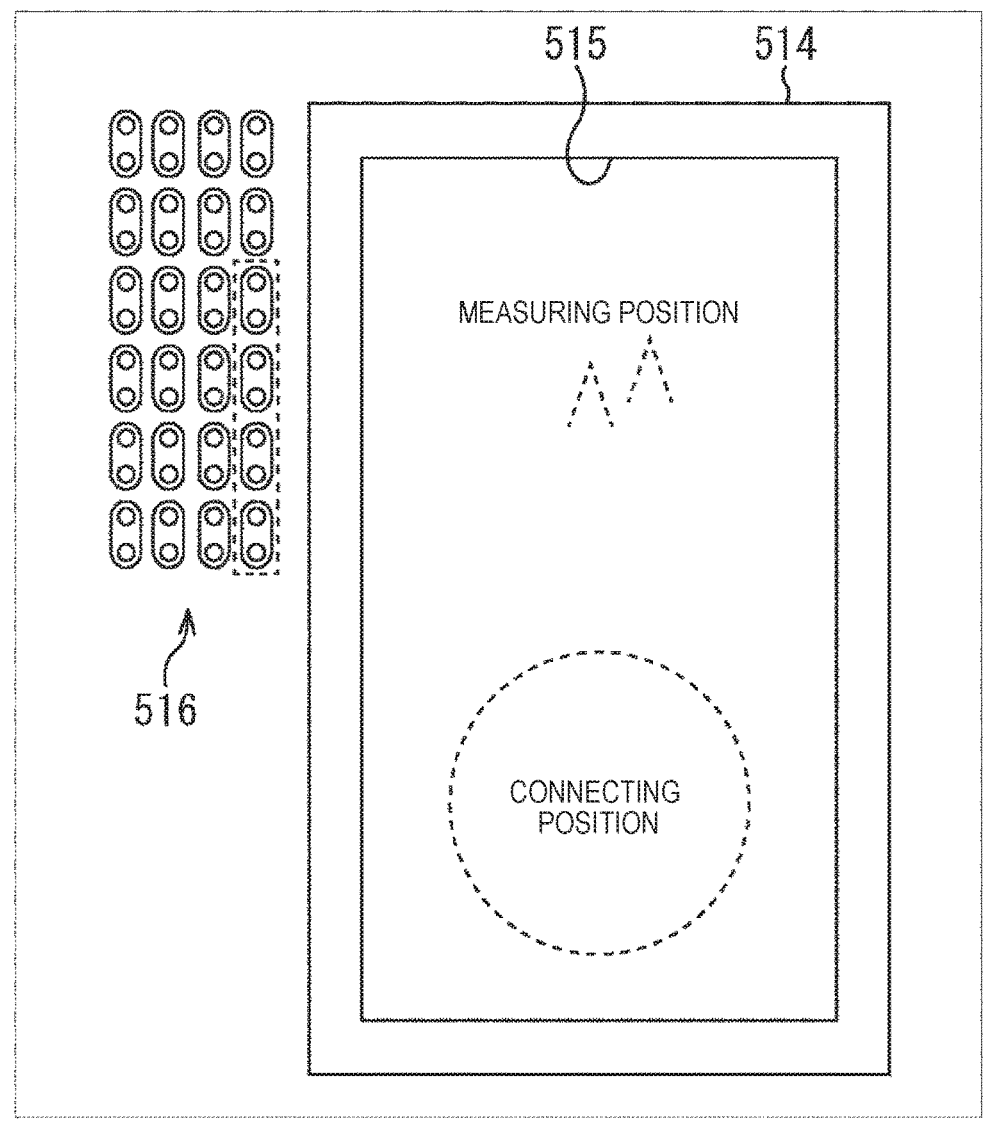
FIG. 10 is a view illustrating a relationship of a measuring position and a connecting position with respect to an aluminum pad.

Next, a relationship between a measuring position and a connecting position for the aluminum pad 514 will be described with reference to FIG. 10. FIG. 10 illustrates an example in which the aluminum pad 514 is viewed from above the pad hole 515.

For example, it is necessary to place a measuring position serving as a region for measuring and a connecting position serving as a region for connecting a wiring from the outside in different regions to reduce probe damage occurring at the aluminum pad 514 when a measurement is performed by a measuring probe. As shown in the drawing, the pad hole 515 is opened in a rectangular shape in a plane view so that the measuring position and the connecting position can be placed in different regions of the aluminum pad 514. For this reason, for example, the pad hole 515 is formed to have an area which is nearly double that of an opening provided in a substrate of another layer.

As shown in FIG. 10, a plurality of contacts 516 are formed near the aluminum pad 514. For example, when the aluminum pad 514 is used as an electrode for a power supply, a maximum number of (24 in the example of FIG. 10) contacts 516 are disposed within a region in which the contacts 516 can be formed to suppress a voltage drop due to an increase in a current value from the power supply. On the other hand, for example, in a wire connection for signal, the number of contacts 516 to be connected is limited to reduce coupling capacitance between a terminal and peripheral wiring. For example, four contacts 516 surrounded by a broken line in FIG. 10 are used. As described above, the number of contacts 516 can be increased or decreased to an appropriate number in accordance with a specification such as resistance or a capacity necessary for a terminal, A subsequent base can be reliably bonded by planarizing a probe mark occurring at the measuring position of the aluminum pad 514.

A planarization of a probe mark will be described with reference to FIG. 11.

As shown in an upper side of FIG. 11, after measurement is performed on the aluminum pad 514, a probe mark 550 is formed on the aluminum pad 514 as shown in the middle of FIG. 11. Thus, when the aluminum pad 514 serving as a measuring electrode is produced by a damascene process, the aluminum pad 514 is planarized by chemical mechanical polishing (CMP) of a metal, and when the aluminum pad 514 is produced by a normal metal such as aluminum, the aluminum pad 514 is planarized by CMP of an interlayer film. Thus, as shown in a lower side of FIG. 11, the aluminum pad 514 is planarized, and a substrate of the first layer 501 is stacked on a substrate of the second layer 502.

Note that the solid-state imaging element 500 has a structure in which substrates are stacked on each other in three layers as described above, but may have a structure in which substrates are stacked in three or more layers.

Next, a method for manufacturing a solid-state imaging element of a four-layer-stacked structure will be described with reference to FIG. 12.

First, in a first step, a circuit 546 formed in a substrate of a fourth layer 504 is measured using an aluminum pad 544 of the substrate of the fourth layer 504. In the substrate of the fourth layer 504, the circuit 546, such as a memory circuit, is formed in a silicon substrate 541, and the circuit 546 is connected to the aluminum pad 544 via a connecting conductor 545. Therefore, for example, the independent circuit 546 can be measured by bringing a measuring probe into contact with the aluminum pad 544.

Subsequently, in a second step, a substrate of the third layer 503 is bonded to the substrate of the fourth layer 504 via a bonding surface 293. In the substrate of the third layer 503, the circuit 536 is connected to the aluminum pad 534 of a rear surface side via the connecting conductor 535, an aluminum pad 537 of a surface side, and a contact 539, and the aluminum pad 534 of the rear surface side is connected to the aluminum pad 544 via a contact 538. Also, the circuit 536 formed in the substrate of the third layer 503 and the circuit 546 formed in the substrate of the fourth layer 504 are measured using the aluminum pad 534 of the rear surface side of the substrate of the third layer 503.

Similarly, in a third step, a substrate of the second layer 502 is bonded to the substrate of the third layer 503 via the bonding surface 292. Also, the circuit 528 formed in the substrate of the second layer 502, the circuit 536 formed in the substrate of the third layer 503, and the circuit 546 formed in the substrate of the fourth layer 504 are measured using the aluminum pad 524 of a rear surface side of the substrate of the second layer 502.

In a fourth step, a substrate of the first layer 501 is bonded to the substrate of the second layer 502 via the bonding surface 291, and the aluminum pad 514 is connected to a wiring for connecting to the outside. Also, the circuit 518 formed in the substrate of the first layer 501, the circuit 528 formed in the substrate of the second layer 502, the circuit 536 formed in the substrate of the third layer 503, and the circuit 546 formed in the substrate of the fourth layer 504 are measured using the aluminum pad 514 of the substrate of the first layer 501.

As described above, a stacked structure can also be constituted in the solid-state imaging element of the four-layer-stacked structure as in the solid-state imaging element 500 of the three-layer-stacked structure. For example, the pad hole 515 configured to expose the aluminum pad 514 is opened from a light-receiving surface side of the substrate of the first layer 501, an aluminum pad used for measurement before stacking is formed in a region of the substrate of the second layer 502 or a subsequent layer which corresponds to the aluminum pad 514 in a plane view, and an electrical circuit or a wiring is disposed in a surplus region other than a region in which the aluminum pad is formed such that dead space is minimized.

In the solid-state imaging element of the four-layer-stacked structure, the aluminum pad 524 of the rear surface side and the aluminum pad 525 of a surface side are formed in the substrate of the second layer 502, and the aluminum pad 534 of the rear surface side and the aluminum pad 537 of the surface side are formed in the substrate of the third layer 503. The aluminum pads can be used for measuring the bases from the rear surface side and the surface side.

FIG. 13 illustrates relationships between aluminum pads used for measurement and substrates to be measured.

In other words, the aluminum pad 525 of a surface side of a substrate of the second layer 502 can be used only for independent measurement in the substrate of the second layer 502 before the substrate of the second layer 502 and a substrate of the third layer 503 are bonded to each other. Similarly, the aluminum pad 537 of a surface side of the substrate of the third layer 503 can be used only for independent measurement in the substrate of the third layer 503 before the substrate of the second layer 502 and the substrate of the third layer 503 are bonded. Also, the aluminum pad 544 of a substrate of the fourth layer 504 can be used only for independent measurement in the substrate of the fourth layer 504 before the substrate of the third layer 503 and the substrate of the fourth layer 504 are bonded.

The aluminum pad 524 of a rear surface side of the substrate of the second layer 502, can be used for independent measurement in the substrate of the second layer 502, independent measurement in the substrate of the third layer 503, and independent measurement in the substrate of the fourth layer 504. Also, the aluminum pad 524 of the rear surface side of the substrate of the second layer 502 can be used for measurement in a stacked product in which the substrate of the second layer 502 and the substrate of the third layer 503 are stacked as a single body, measurement in a stacked product in which the substrate of the third layer 503 and the substrate of the fourth layer 504 are stacked as a single body, and measurement in a stacked product in which the substrate of the second layer 502 and the substrate of the fourth layer 504 are stacked as a single body. The aluminum pad 524 of the rear surface side of the substrate of the second layer 502 can be used for measurement in a stacked product in which the substrate of the second layer 502, the substrate of the third layer 503, and the substrate of the fourth layer 504 are stacked as a single body.

Also, the aluminum pad 534 of a rear surface side of the substrate of the third layer 503 can be used for independent measurement in the substrate of the third layer 503, independent measurement in the substrate of the fourth layer 504, and measurement in the stacked product in which the substrate of the third layer 503 and the substrate of the fourth layer 504 are stacked as a single body.

Here, as described above, for example, since the pad hole 515 is formed to have an area which is nearly double that of on opening provided in a substrate of another layer, a portion other than the aluminum pad 524 of the rear surface side of the substrate of the second layer 502 and the aluminum pad 534 of the substrate of the third layer 503 remains as a surplus region even in terminals having the same function.

The aluminum pad 524 or the aluminum pad 534 are not disposed or are disposed smaller than the aluminum pad 514 directly under the aluminum pad 514 formed in the substrate of the first layer 501 and within the substrate of the second layer 502 or the substrate of the third layer 503 so that an electrical circuit, a wiring, or the like is disposed in the region which remains as a surplus portion. Thus, the region which remains as a surplus portion can be effectively utilized.

Figure 14:
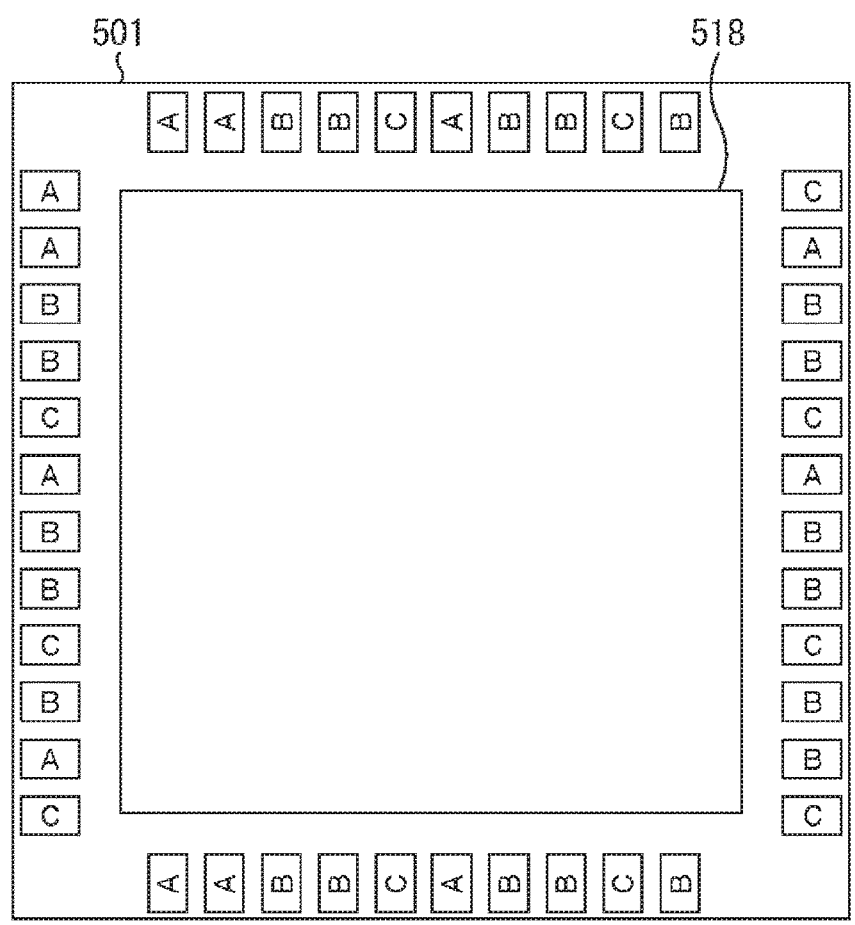
FIG. 14 is a plan view of a substrate of a first layer.
Figure 15:
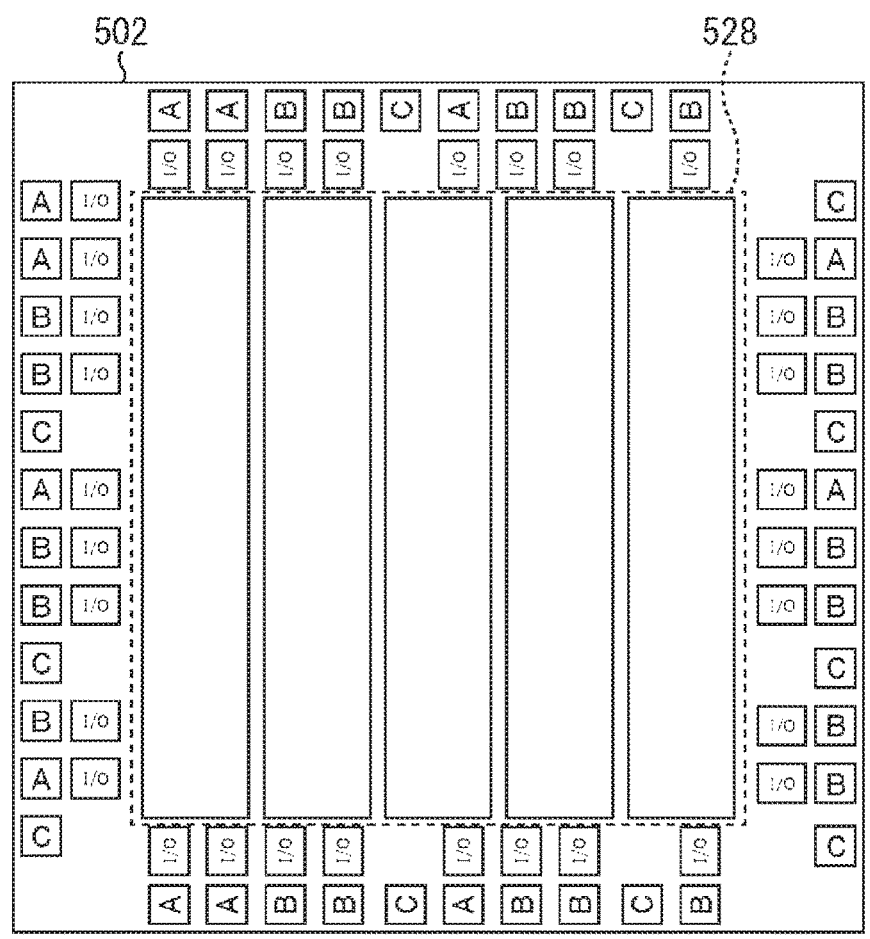
FIG. 15 is a plan view of a substrate of a second layer.
Figure 16:
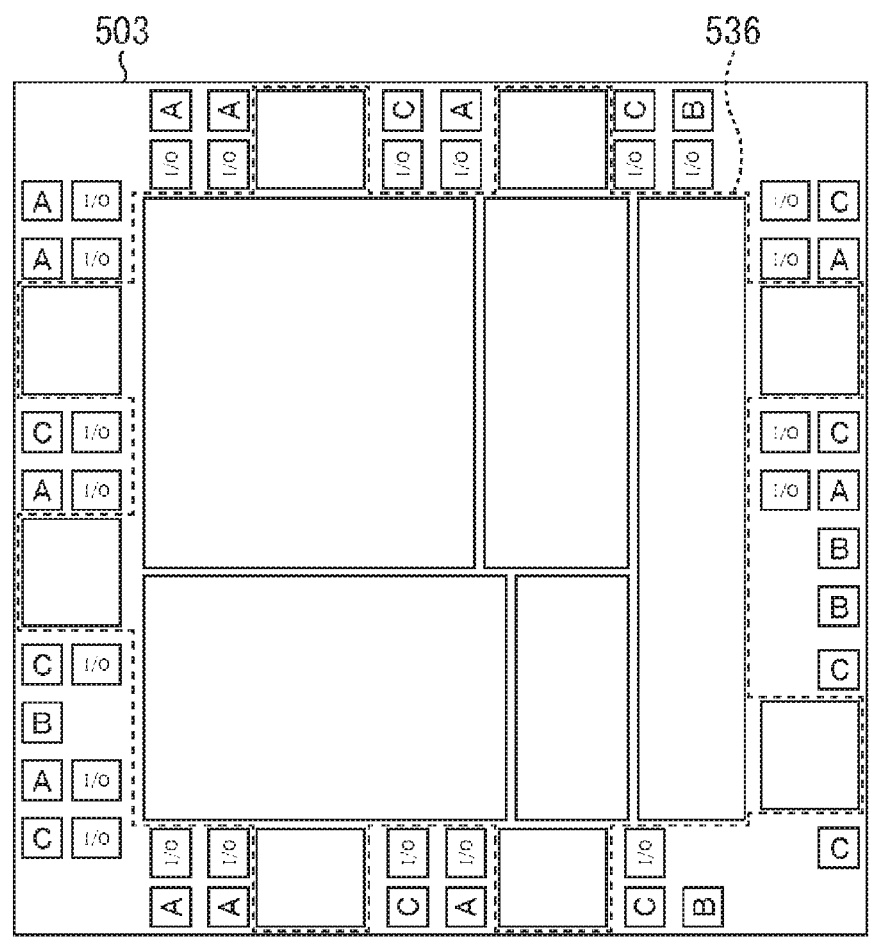
FIG. 16 is a plan view of a substrate of a third layer.

In other words, utilization of the region which remains as a surplus portion will be described with reference to FIGS. 14 to 16. FIG. 14 shows a plan view of a substrate of the first layer 501. FIG. 15 shows a plan view of a substrate of the second layer 502, and FIG. 16 shows a plan view of a substrate of the third layer 503.

As shown in FIG. 14, the circuit 518, such as a sensor circuit, is formed in the middle of the substrate of the first layer 501. In the substrate of the first layer 501, a plurality of aluminum pads 514 are formed in the vicinity of the circuit 518. In addition, in FIG. 14, the aluminum pads 514 of the connection configuration A are denoted by reference numeral A, the aluminum pads 514 of the connection configuration B are denoted by reference numeral B, and the aluminum pads 514 of the connection configuration C are denoted by reference numeral C.

As shown in FIG. 15, in a substrate of the second layer 502, the circuit 528, such as a dynamic random access memory (DRAM) circuit, is formed to correspond to a region of the substrate of the first layer 501 in which the circuit 518 is formed. Also, in the substrate of the second layer 502, a plurality of aluminum pads 524 are formed in the vicinity of the circuit 528. In addition, in FIG. 15, the aluminum pads 524 of the connection configuration A are denoted by reference numeral A, the aluminum pads 524 of the connection configuration B are denoted by reference numeral B, and the aluminum pads 524 of the connection configuration C are denoted by reference numeral C. In other words, the aluminum pads 524 denoted by reference numeral C are test pads only in the substrate of the second layer 502.

The aluminum pads 524 are formed smaller than the aluminum pads 514 of the first layer, and surplus regions thereof are set as regions (regions denoted as I/O in FIG. 15) in which the contacts 526 are formed.

As shown in FIG. 16, in the substrate of the third layer 503, the circuit 536, such as a logic circuit, is formed to correspond to the region of the substrate of the first layer 501 in which the circuit 518 is formed. Also, in the substrate of the third layer 503, a plurality of aluminum pads 534 are formed in the vicinity of the circuit 536. In addition, in FIG. 16, the aluminum pads 524 of the connection configuration A are denoted by reference numeral A, the aluminum pads 524 of the connection configuration B are denoted by reference numeral B, and the aluminum pads 524 of the connection configuration C are denoted by reference numeral C. In other words, the aluminum pads 524 denoted by reference numeral B are test pads only in the substrate of the third layer 503.

An aluminum pad is not provided in a region in which a connection is not performed from the outside to the substrate of the third layer 503 like in the connection configuration B, and a logic circuit is also formed in a surplus region thereof. Note that an electro static discharge (ESD) protection element or the like which is used by being combined with a pad electrode can be most easily incorporated as a circuit, but another circuit can be used.

As described above, in the solid-state imaging element 500, utilization efficiency of a substrate can be increased by effectively utilizing a surplus region.

Also, in the solid-state imaging element 500, a test circuit can be shared with a plurality of chips to increase utilization efficiency of a substrate.

Sharing of a test circuit will be described with reference to FIG. 17. A of FIG. 17 shows a plan view of two chips (a product 1 and a product 2) serving as the solid-state imaging element 500, and B of FIG. 17 shows a cross-sectional view thereof.

Figure 17:
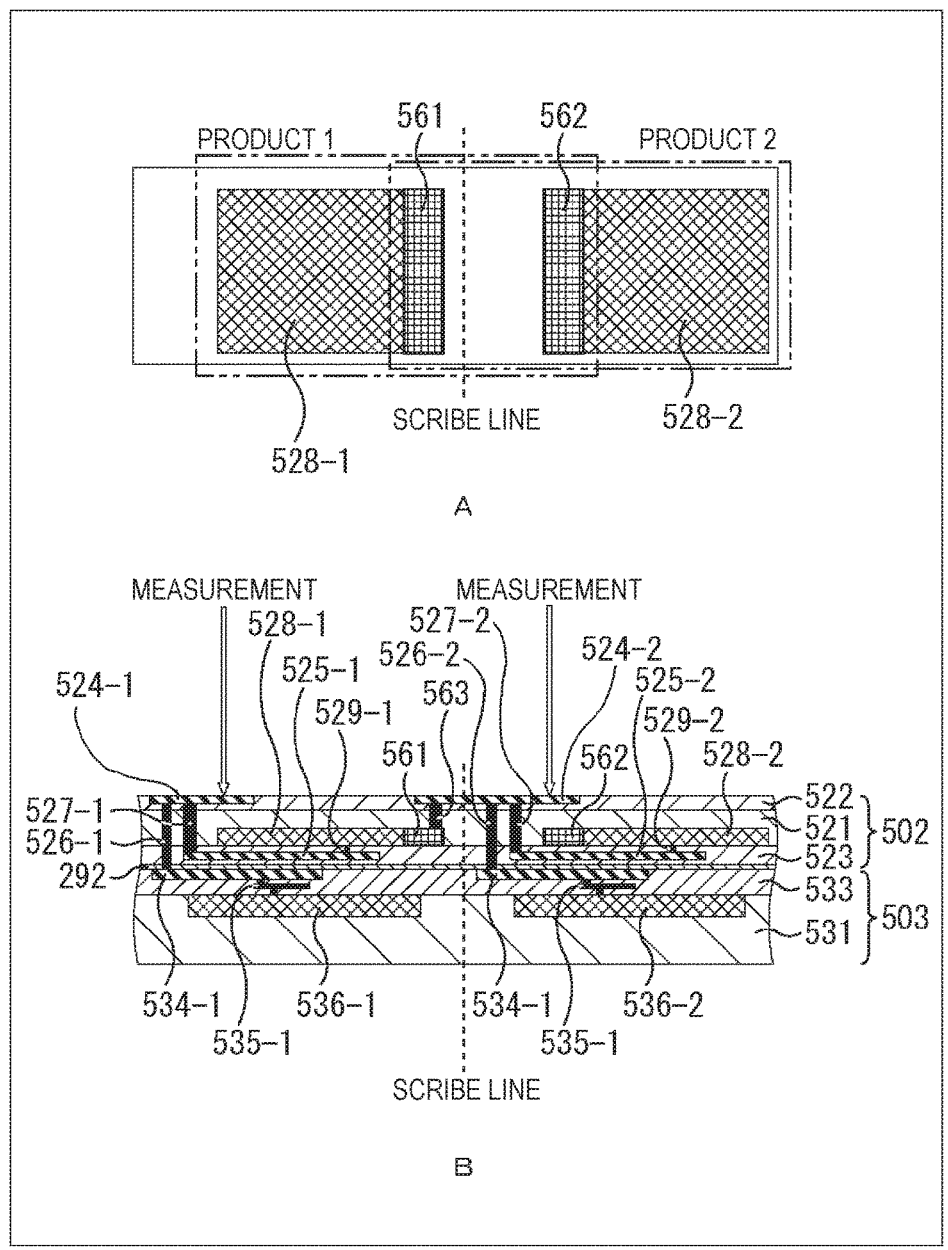
FIG. 17 is a view for describing sharing of test circuits.

As shown in FIG. 17, the two chips are divided along a scribe line indicated by a broken line, and a test circuit 561 and a test circuit 562 are formed across the scribe line using the aluminum pads 524 of the rear surface side of the substrate of the second layer 502. Note that a configuration other than the test circuit 561 and the test circuit 562 is, for example, a configuration in which a circuit 528-1, a circuit 528-2, a circuit 536-1, a circuit 536-2, or the like are shared with chips. Even after a subsequent stacking, common products may be stacked over the scribe line.

As described above, the test circuit 561 and the test circuit 562, which are not used in a substrate of the first layer 501, are disposed across a chip and can be commonly used by adjacent chips. Note that a redundant circuit or the like may be disposed across a chip in addition to a test circuit.

Thus, since a test circuit, a redundant circuit, or the like can be distributed between chips, utilization efficiency can be increased compared to a configuration in which a test circuit, a redundant circuit, or the like are provide for every chip.

Also, a test circuit, a redundant circuit, or the like may be commonly used between upper and lower substrates.

Common usage between upper and lower substrates will be described with reference to FIG. 18.

Figure 18:
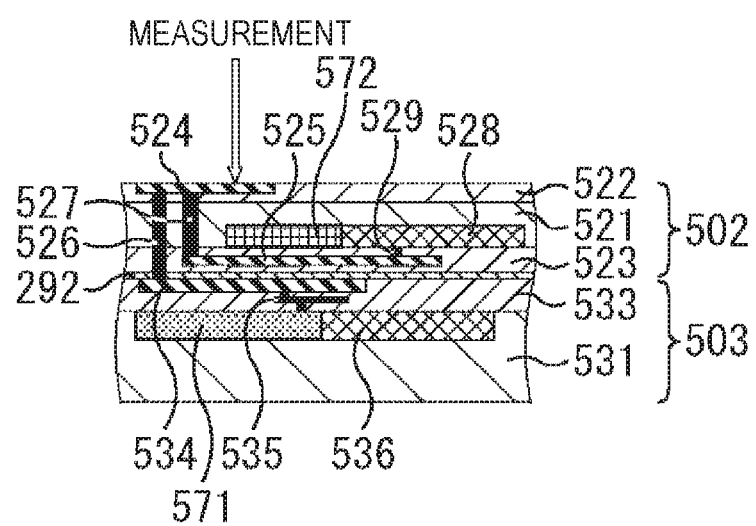
FIG. 18 is a view for describing common usage between upper and lower substrates.

As shown in FIG. 18, a test circuit 572 is disposed in a substrate of the second layer 502, a redundant circuit 571 is disposed in a substrate of the third layer 503, and the test circuit 572 is electrically connected to the redundant circuit 571. Thus, the test circuit 572 and the redundant circuit 571 can be commonly used by the substrate of the second layer 502 and the substrate of the third layer 503. For example, when measurement using the aluminum pad 524 of a rear surface side of the substrate of the second layer 502 is performed, the circuit 536 of the substrate of the third layer 503 can be tested using the test circuit 572 of the substrate of the second layer 502. Also, for example, as a result of the testing, when it is necessary to perform redundant relief on the circuit 528 of the substrate of the second layer 502, the redundant circuit 571 of the substrate of the third layer 503 can be used.

For example, in general, when redundant relief is performed on a chip for which it has been determined whether an element thereof is good or bad, the chip is repaired using a fuse or a redundant circuit in the same substrate. On the other hand, in a stacked substrate, a redundant circuit is disposed in another stacked substrate, and relief can be performed across substrates connected through a contact. As described above, as a redundant process is performed when a test is performed after substrates are bonded and connected to each other, disposing a fuse, a redundant circuit, or the like for every substrate can be avoided, and utilization efficiency of a substrate can thus be increased.

Also, in a three-layer-stacked chip, terminals of various functions, such as independent functional verification of each layer, functional verification of an entire stacked chip, and connection to an external substrate, are necessary. However, when all of the terminals are built in a first semiconductor substrate, a large area of an effective imaging region is occupied by a terminal forming region.

For this reason, like the solid-state imaging element 500, as an opening electrode to be built in a first semiconductor substrate, only a terminal necessary for measurement evaluation of an interface of the same substrate itself and a product is served in a narrowing manner, and another electrode may be built in a second semiconductor substrate or a semiconductor substrate of a subsequent layer. Also, in measuring electrode terminals to be built in second and third semiconductor substrates, terminals having common functions with an external connecting terminal of the first semiconductor substrate like a power supply terminal can be set to have a common potential by connecting the terminals using through electrodes. On the other hand, when terminals are attempted to have independent functions like measuring signal terminals within the second and third semiconductor substrates, the terminals are not connected to each other using through electrodes so that the terminals are electrically isolated from each other. In both cases, the opening electrode built in the first semiconductor substrate and measuring electrodes built in the second and third semiconductor substrates can be designed such that the opening electrode and the measuring electrodes overlap each other in a longitudinal direction and fall within the same footprint.

Thus, terminals can be properly divided and used as terminals which are commonly used in the first, second, and third semiconductor substrates and as independently used terminals according to necessity, and electrode terminals having different functions can be stacked within the same footprint. Also, a surplus region being generated in a footprint, such as when an area necessary for external connecting terminals of the first semiconductor substrate is larger than an area necessary for measuring terminals of the second and third substrates and when the number of external connecting terminals of the first semiconductor substrate is greater than the number of measuring terminals of the second and third substrates, is also considered. In such a situation, it is also considered that a part, such as an electrical circuit and a wiring, necessary for a chip main body area is also built directly under an external connecting terminal of the first semiconductor substrate, and substrates are stacked. A region regarded as dead space in the related art can be effectively used using the above-described technique.

Figure 19:
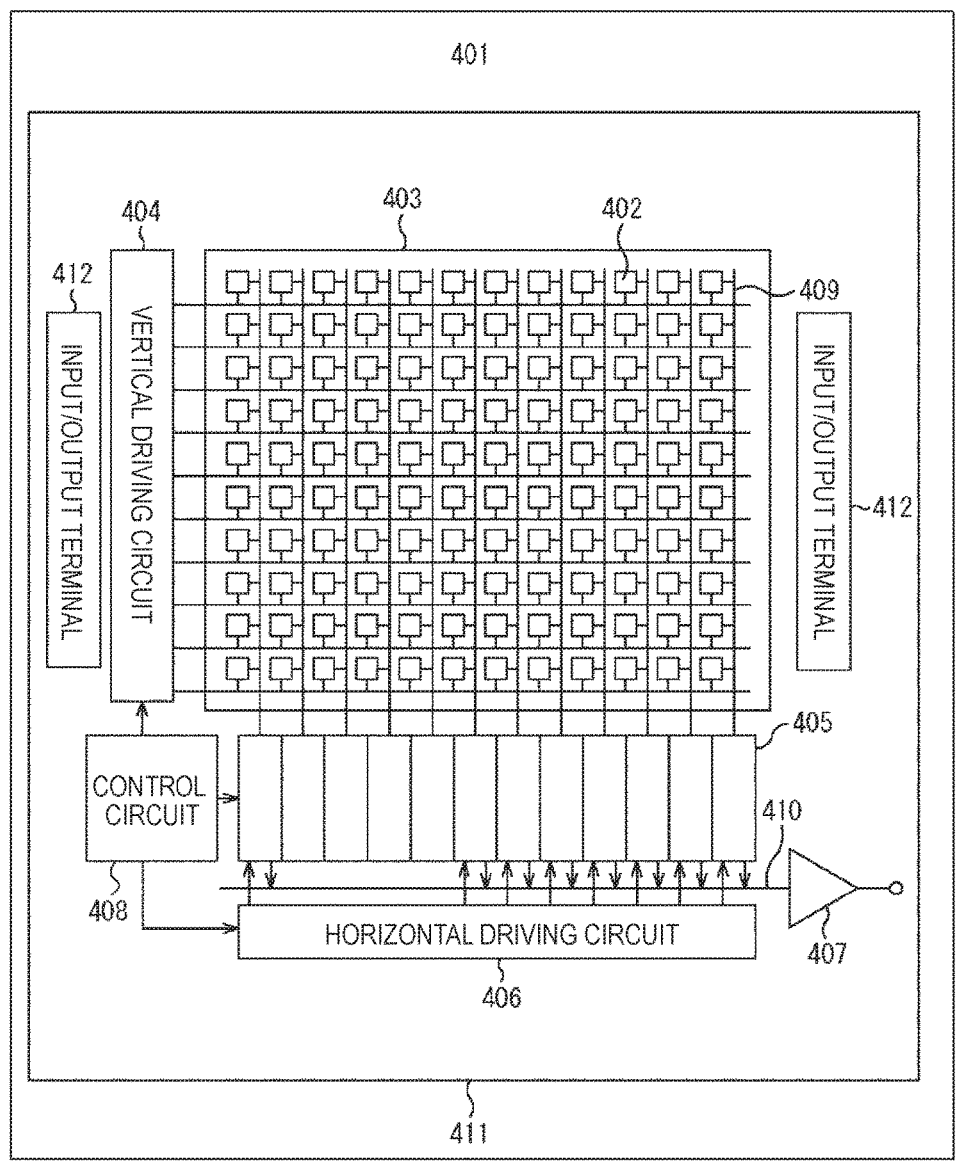
FIG. 19 is a view showing a schematic configuration of a solid-state imaging device to which the present technique is applied.

FIG. 19 is a view showing a schematic configuration of a solid-state imaging device to which the present technique is applied. A solid-state imaging device 401 is constituted as, for example, a CMOS image sensor.

The solid-state imaging device 401 of FIG. 19 is constituted by a pixel region (a so-called pixel array) 403 in which pixels 402 having a plurality of photoelectric conversion parts are regularly arranged in a semiconductor substrate 411 two-dimensionally, and a peripheral circuit part.

The pixels 402 are each constituted by, for example, PDs serving as photoelectric conversion parts and a plurality of pixel transistors (so-called MOS transistors).

Also, the pixels 402 can also be set to have a shared pixel structure. The shared pixel structure is constituted by a plurality of PDs, a plurality of transfer transistors, one FD which is shared, and other pixel transistors which are shared.

The peripheral circuit part is constituted by a vertical driving circuit 404, column signal processing circuits 405, a horizontal driving circuit 406, an output circuit 407, a control circuit 408, and the like.

The control circuit 408 receives an input clock and data used to give an instruction of an operation mode or the like and outputs data such as internal information of the solid-state imaging device. In other words, the control circuit 408 generates a clock signal or a control signal serving as a reference of operations of the vertical driving circuit 404, the column signal processing circuits 405, the horizontal driving circuit 406, and the like based on a vertical synchronization signal, a horizontal synchronization signal, and a master clock. In addition, the signals are input to the vertical driving circuit 404, the column signal processing circuits 405, the horizontal driving circuit 406, and the like.

The vertical driving circuit 404 is constituted by, for example, a shift register and selects a pixel driving wiring, supplies a pulse used to drive a pixel to the selected pixel driving wiring, and drives pixels in units of rows. In other words, the vertical driving circuit 404 sequentially selects and scans the pixels 402 of the pixel region 403 in a vertical direction in units of rows, and supplies a pixel signal based on a signal charge generated at each of, for example, the PDs serving as the photoelectric conversion parts of pixels 402 in accordance with an amount of received light to the column signal processing circuits 405 through vertical signal lines 409.

The column signal processing circuits 405 are disposed, for example, for every column of the pixels 402, and perform a signal process such as noise removal on signals output from one row of the pixels 402 for every pixel column. In other words, the column signal processing circuits 405 perform a signal process such as correlated double sampling (CDS) used to remove fixed pattern noise unique to the pixels 402, signal amplification, or analog-to-digital (AD) conversion. Horizontal selection switches (not shown) are provided to output stages of the column signal processing circuits 405 such that the horizontal selection switches are connected between the output stages of the column signal processing circuits 405 and a horizontal signal line 410.

The horizontal driving circuit 406 is constituted by, for example, a shift register and sequentially outputs horizontal scanning pulses to sequentially select the column signal processing circuit 405 and causes the column signal processing circuits 405 to output pixel signals to the horizontal signal line 410.

The output circuit 407 performs signal processing on signals sequentially supplied from the column signal processing circuit 405 via the horizontal signal line 410, and outputs the signals. For example, only buffering is performed in some cases, and black level adjustment, column variation correction, various digital signal processes, or the like is performed in some cases. An input/output terminal 412 exchanges a signal with the outside.

The solid-state imaging device 401 shown in FIG. 19 is constituted as a backside-illuminated CMOS image sensor of a three-layer-stacked structure. For example, the pixels 402 shown in FIG. 19 are set as a sensor circuit formed in a first semiconductor substrate, and peripheral circuits are set as a logic circuit formed in a second semiconductor substrate or a memory circuit formed in a third semiconductor substrate.

Figure 20:
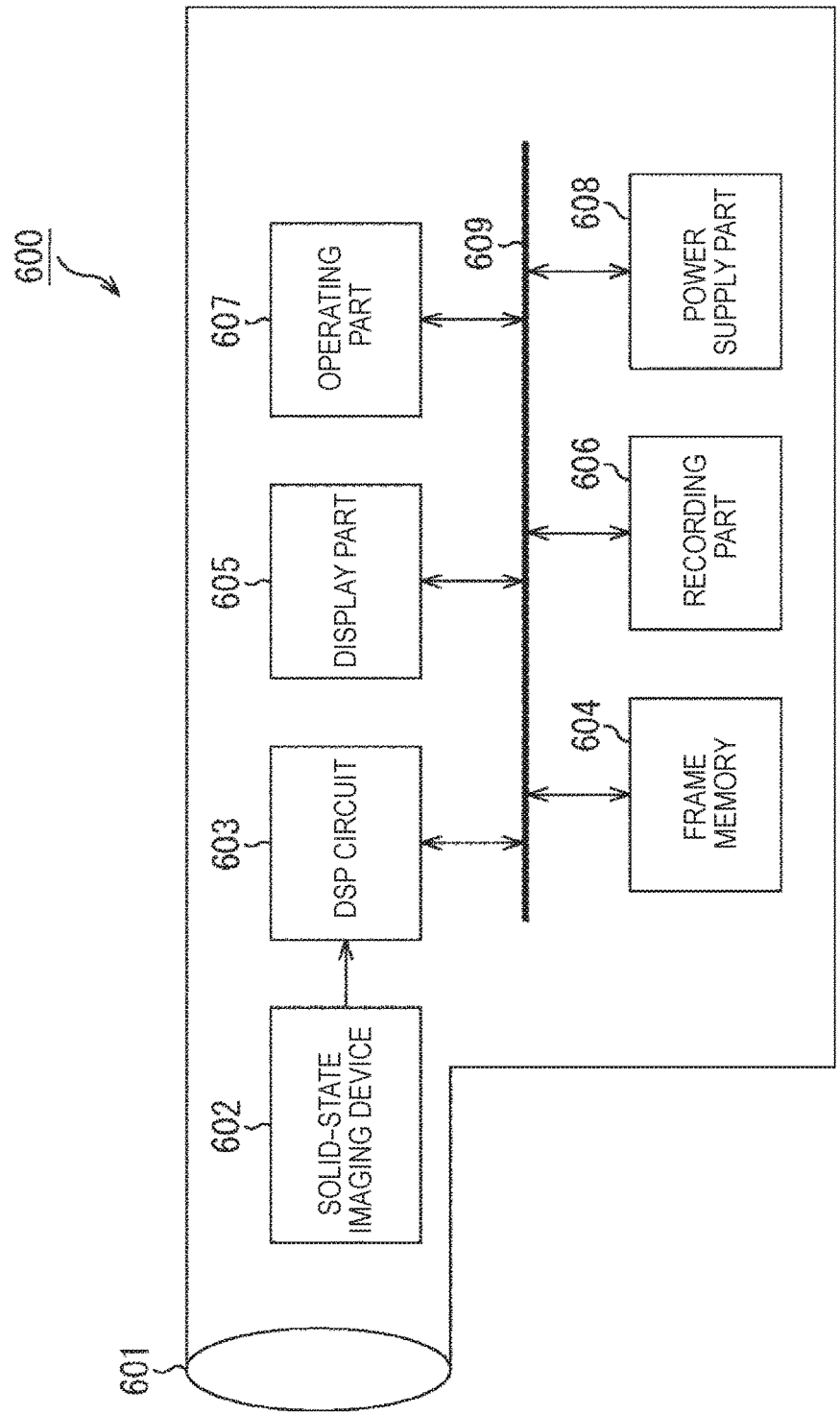
FIG. 20 is a block diagram showing a configuration example of an electronic device to which the present technique is applied.

FIG. 20 is a block diagram showing a configuration example of a camera device serving as an electronic device to which the present technique is applied.

The camera device 600 of FIG. 20 includes an optical part 601 constituted by a lens group or the like, a solid-state imaging device (an imaging device) 602 in which configurations of the above-described pixels 402 are adopted, and a digital signal processing (DSP) circuit 603 serving as a camera signal processing circuit. Also, the camera device 600 also includes a frame memory 604, a display part 605, a recording part 606, an operating part 607, and a power supply part 608. The DSP circuit 603, the frame memory 604, the display part 605, the recording part 606, the operating part 607, and the power supply part 608 are connected to each other via a bus line 609.

The optical part 601 captures incident light (image light) from a subject, and forms an image on an imaging surface of the solid-state imaging device 602. The solid-state imaging device 602 converts a quantity of light of the incident light formed on the imaging surface by the optical part 601 into an electrical signal in units of pixels, and outputs the electrical signal as a pixel signal. The solid-state imaging devices related to the above-described embodiments can be used as the solid-state imaging device 602.

The display part 605 is constituted by a panel type display device such as, for example, a liquid crystal panel or an electro luminescence (EL) panel, and displays a moving image or a still image captured by the solid-state imaging device 602. The recording part 606 records a moving image or a still image captured by the solid-state imaging device 602 on a recording medium such as a video tape, a digital versatile disk (DVD), or the like.

The operating part 607 issues operation instructions of various functions of the camera device 600 wider an operation by a user. The power supply part 608 appropriately supplies a variety of power serving as operating power of the DSP circuit 603, the frame memory 604, the display part 605, the recording part 606, and the operating part 607 to the supply targets.

The present technique is not limited to being applied to a solid-state imaging element which detects distribution of a quantity of incident light of visible light and captures the distribution as an image, but can be applied to a solid-state imaging element which captures distribution of an incident amount of infrared rays, X-rays, particles, or the like as an image, and a general solid-state imaging element (a physical quantity distribution detecting device) in a broad sense such as a fingerprint detection sensor which detects another physical quantity such pressure, capacitance, or the like and captures distribution of an image.

Additionally, the present technology may also be configured as below (1)

A solid-state imaging device including:

a first semiconductor substrate provided with a sensor circuit having a photoelectric conversion part; and a second semiconductor substrate and a third semiconductor substrate provided with respective circuits different from the sensor circuit, wherein the first semiconductor substrate serves as an uppermost layer, and the first semiconductor substrate, the second semiconductor substrate, and the third semiconductor substrate are stacked on each other in three layers, a metal element for an electrode constituting an electrode for external connection is disposed in the first semiconductor substrate, and a metal element for an electrode constituting an electrode for a measuring terminal is disposed within the second semiconductor substrate or the third semiconductor substrate, and the first semiconductor substrate is stacked after performing a predetermined measurement.

(2)

The solid-state imaging device according to (1), wherein the sensor circuit of the first semiconductor substrate is set as a backside-illuminated type, and a hole configured to expose the metal element for the electrode is opened from a light-receiving surface side of the first semiconductor substrate.

(3)

The solid-state imaging device according to (1) or (2), wherein electrical connections between the electrode for external connection disposed within the first semiconductor substrate and the measuring electrode disposed within the second semiconductor substrate and between the measuring electrode disposed within the second semiconductor substrate and the measuring electrode disposed within the third semiconductor substrate are formed using through electrodes.

(4)

The solid-state imaging device according to any one of (1) to (3), wherein connections between the electrode for external connection disposed within the first semiconductor substrate and the measuring electrode disposed within the second semiconductor substrate or between the measuring electrode disposed within the second semiconductor substrate and the measuring electrode disposed within the third semiconductor substrate are electrically isolated from each other.

(5)

The solid-state imaging device according to any one of (1) to (4), wherein connections between the electrode for external connection disposed within the first semiconductor substrate and the measuring electrode disposed within the second semiconductor substrate and between the measuring electrode disposed within the second semiconductor substrate and the measuring electrode disposed within the third semiconductor substrate are electrically isolated from each other.

(6)

The solid-state imaging device according to any one of (1) to (5), wherein one or both of a measuring electrode which enables a probe to be brought into contact from a surface serving as an element forming surface and a measuring electrode which enables the probe to be brought into contact from a rear surface serving as an opposite side to the surface are formed as the measuring electrode disposed within the second semiconductor substrate.

(7)

The solid-state imaging device according to any one of (1) to (6), wherein the electrode for external connection disposed within the first semiconductor substrate, the measuring electrode disposed within the second semiconductor substrate, and the measuring electrode disposed within the third semiconductor substrate are disposed in a mixed manner.

(8)

The solid-state imaging device according to any one of (1) to (7), wherein a wafer is selected, discarded, or set to have redundancy repaired before the first semiconductor substrate is stacked by performing a measurement using the measuring electrode disposed within the second semiconductor substrate or the third semiconductor substrate.

(9)

The solid-state imaging device according to any one of (1) to (8), wherein, in the electrode for the measuring terminal, the number of through electrodes which connect the electrodes is increased or decreased in accordance with resistance or a capacity specification necessary for the terminal.

(10)

The solid-state imaging device according to any one of (1) to (9), wherein, even when a substrate of a fourth layer or more is stacked, a hole configured to expose the metal element for the electrode is opened from a light-receiving surface side of the first semiconductor substrate, a metal element for an electrode used for measuring before stacking is formed in the same region of the second semiconductor substrate or a semiconductor substrate of a subsequent layer, and an electrode circuit or a wiring is disposed in a surplus region in which the metal element for the electrode is not formed.

(11)

The solid-state imaging device according to any one of (1) to (10), wherein a probe mark formed on the measuring electrode is planarized for measuring before stacking.

(12)

A method for manufacturing a solid-state imaging device which includes a first semiconductor substrate provided with a sensor circuit having a photoelectric conversion part and a second semiconductor substrate and a third semiconductor substrate provided with respective circuits different from the sensor circuit, the method including the steps of:

serving the first semiconductor substrate as an uppermost layer, and stacking the first semiconductor substrate, the second semiconductor substrate, and the third semiconductor substrate on each other in three layers;

disposing a metal element for an electrode constituting an electrode for external connection in the first semiconductor substrate; and disposing a metal element for an electrode constituting an electrode for a measuring terminal within the second semiconductor substrate or the third semiconductor substrate, and stacking the first semiconductor substrate after performing a predetermined measurement.

(13)
An electronic device including:
a solid-state imaging device which includes:
a first semiconductor substrate provided with a sensor circuit having a photoelectric conversion part; and
a second semiconductor substrate and a third semiconductor substrate provided with respective circuits different from the sensor circuit,
wherein the first semiconductor substrate serves as an uppermost layer, and the first semiconductor substrate, the second semiconductor substrate, and the third semiconductor substrate are stacked on each other in three layers,
a metal element for an electrode constituting an electrode for external connection is disposed in the first semiconductor substrate, and
a metal element for an electrode constituting an electrode for a measuring terminal is disposed within the second semiconductor substrate or the third semiconductor substrate, and the first semiconductor substrate is stacked after performing a predetermined measurement.

Note that the embodiments are not limited to the above-described embodiments but can be modified in various manners without departing from the gist of the present disclosure.

REFERENCE SIGNS LIST 211 first semiconductor substrate
212 second semiconductor substrate
213 third semiconductor substrate
234 photodiodes
245 multi-layer wiring layer
240 copper wiring
255 multi-layer wiring layer
250 copper wiring
265 contact
280 aluminum pad
320 aluminum pad
330 aluminum pad
340 copper wiring
345 multi-layer wiring layer
311 contact
351 pad hole
360 light shielding body
370 copper wiring
401 solid-state imaging device
402 pixel
600 camera device
602 solid-state imaging device

What is claimed is:

1. A solid-state imaging device comprising:
a first semiconductor substrate provided with a sensor circuit having a photoelectric conversion part; and
a second semiconductor substrate and a third semiconductor substrate provided with respective circuits different from the sensor circuit,
wherein the first semiconductor substrate serves as an uppermost layer, and the first semiconductor substrate, the second semiconductor substrate, and the third semiconductor substrate are stacked on each other in three layers,
a metal element for an electrode constituting an electrode for external connection is disposed in the first semiconductor substrate, and
a metal element for an electrode constituting an electrode for a measuring terminal is disposed within the second semiconductor substrate or the third semiconductor substrate, and the first semiconductor substrate is stacked after performing a predetermined measurement, wherein one or both of a measuring electrode which enables a probe to be brought into contact from a surface serving as an element forming surface and a measuring electrode which enables the probe to be brought into contact from a rear surface serving as an opposite side to the surface are formed as the measuring electrode disposed within the second semiconductor substrate.

2. The solid-state imaging device according to claim 1, wherein the sensor circuit of the first semiconductor substrate is set as a backside-illuminated type, and a hole configured to expose the metal element for the electrode is opened from a light-receiving surface side of the first semiconductor substrate.

3. The solid-state imaging device according to claim 1, wherein electrical connections between the electrode for external connection disposed within the first semiconductor substrate and the measuring electrode disposed within the second semiconductor substrate and between the measuring electrode disposed within the second semiconductor substrate and the measuring electrode disposed within the third semiconductor substrate are formed using through electrodes.

4. The solid-state imaging device according to claim 1, wherein connections between the electrode for external connection disposed within the first semiconductor substrate and the measuring electrode disposed within the second semiconductor substrate or between the measuring electrode disposed within the second semiconductor substrate and the measuring electrode disposed within the third semiconductor substrate are electrically isolated from each other.

5. The solid-state imaging device according to claim 1, wherein a wafer is selected, discarded, or set to have redundancy repaired before the first semiconductor substrate is stacked by performing a measurement using the measuring electrode disposed within the second semiconductor substrate or the third semiconductor substrate.

6. The solid-state imaging device according to claim 1, wherein, in the electrode for the measuring terminal, the number of through electrodes which connect the electrodes is increased or decreased in accordance with resistance or a capacity specification necessary for the terminal.

7. The solid-state imaging device according to claim 1, wherein an electrical circuit or a wiring is disposed in a region directly under the electrode for external connection formed in the first semiconductor substrate and in which the measuring electrode is not necessary within the second semiconductor substrate or the third semiconductor substrate.

8. A solid-state imaging device comprising:
a first semiconductor substrate provided with a sensor circuit having a photoelectric conversion part; and
a second semiconductor substrate and a third semiconductor substrate provided with respective circuits different from the sensor circuit,
wherein the first semiconductor substrate serves as an uppermost layer, and the first semiconductor substrate, the second semiconductor substrate, and the third semiconductor substrate are stacked on each other in three layers,
a metal element for an electrode constituting an electrode for external connection is disposed in the first semiconductor substrate, and
a metal element for an electrode constituting an electrode for a measuring terminal is disposed within the second semiconductor substrate or the third semiconductor substrate, and the first semiconductor substrate is stacked after performing a predetermined measurement, wherein an electrical circuit or a wiring is disposed in a region directly under the electrode for external connection formed in the first semiconductor substrate and in which the measuring electrode is not necessary within the second semiconductor substrate or the third semiconductor substrate.

9. The solid-state imaging device according to claim 8, wherein the sensor circuit of the first semiconductor substrate is set as a backside-illuminated type, and a hole configured to expose the metal element for the electrode is opened from a light-receiving surface side of the first semiconductor substrate.

10. The solid-state imaging device according to claim 8, wherein electrical connections between the electrode for external connection disposed within the first semiconductor substrate and the measuring electrode disposed within the second semiconductor substrate and between the measuring electrode disposed within the second semiconductor substrate and the measuring electrode disposed within the third semiconductor substrate are formed using through electrodes.

11. The solid-state imaging device according to claim 8, wherein connections between the electrode for external connection disposed within the first semiconductor substrate and the measuring electrode disposed within the second semiconductor substrate or between the measuring electrode disposed within the second semiconductor substrate and the measuring electrode disposed within the third semiconductor substrate are electrically isolated from each other.

12. A solid-state imaging device comprising:
a first semiconductor substrate provided with a sensor circuit having a photoelectric conversion part; and
a second semiconductor substrate and a third semiconductor substrate provided with respective circuits different from the sensor circuit,
wherein the first semiconductor substrate serves as an uppermost layer, and the first semiconductor substrate, the second semiconductor substrate, and the third semiconductor substrate are stacked on each other in three layers,
a metal element for an electrode constituting an electrode for external connection is disposed in the first semiconductor substrate, and
a metal element for an electrode constituting an electrode for a measuring terminal is disposed within the second semiconductor substrate or the third semiconductor substrate, and the first semiconductor substrate is stacked after performing a predetermined measurement, wherein the electrode for external connection disposed within the first semiconductor substrate, the measuring electrode disposed within the second semiconductor substrate, and the measuring electrode disposed within the third semiconductor substrate are disposed in a mixed manner.

13. The solid-state imaging device according to claim 12, wherein the sensor circuit of the first semiconductor substrate is set as a backside-illuminated type, and a hole configured to expose the metal element for the electrode is opened from a light-receiving surface side of the first semiconductor substrate.

14. The solid-state imaging device according to claim 12, wherein electrical connections between the electrode for external connection disposed within the first semiconductor substrate and the measuring electrode disposed within the second semiconductor substrate and between the measuring electrode disposed within the second semiconductor substrate and the measuring electrode disposed within the third semiconductor substrate are formed using through electrodes.

15. The solid-state imaging device according to claim 12, wherein connections between the electrode for external connection disposed within the first semiconductor substrate and the measuring electrode disposed within the second semiconductor substrate or between the measuring electrode disposed within the second semiconductor substrate and the measuring electrode disposed within the third semiconductor substrate are electrically isolated from each other.

16. A solid-state imaging device comprising:
a first semiconductor substrate provided with a sensor circuit having a photoelectric conversion part; and
a second semiconductor substrate and a third semiconductor substrate provided with respective circuits different from the sensor circuit,
wherein the first semiconductor substrate serves as an uppermost layer, and the first semiconductor substrate, the second semiconductor substrate, and the third semiconductor substrate are stacked on each other in three layers,
a metal element for an electrode constituting an electrode for external connection is disposed in the first semiconductor substrate, and
a metal element for an electrode constituting an electrode for a measuring terminal is disposed within the second semiconductor substrate or the third semiconductor substrate, and the first semiconductor substrate is stacked after performing a predetermined measurement, wherein, even when a substrate of a fourth layer or more is stacked, a hole configured to expose the metal element for the electrode is opened from a light-receiving surface side of the first semiconductor substrate, a metal element for an electrode used for measuring before stacking is formed in the same region of the second semiconductor substrate or a semiconductor substrate of a subsequent layer, and an electrode circuit or a wiring is disposed in a surplus region in which the metal element for the electrode is not formed.

17. The solid-state imaging device according to claim 16, wherein the sensor circuit of the first semiconductor substrate is set as a backside-illuminated type, and a hole configured to expose the metal element for the electrode is opened from a light-receiving surface side of the first semiconductor substrate.

18. The solid-state imaging device according to claim 16, wherein electrical connections between the electrode for external connection disposed within the first semiconductor substrate and the measuring electrode disposed within the second semiconductor substrate and between the measuring electrode disposed within the second semiconductor substrate and the measuring electrode disposed within the third semiconductor substrate are formed using through electrodes.

19. The solid-state imaging device according to claim 16, wherein connections between the electrode for external connection disposed within the first semiconductor substrate and the measuring electrode disposed within the second semiconductor substrate or between the measuring electrode disposed within the second semiconductor substrate and the measuring electrode disposed within the third semiconductor substrate are electrically isolated from each other.

20. A solid-state imaging device comprising:
a first semiconductor substrate provided with a sensor circuit having a photoelectric conversion part; and
a second semiconductor substrate and a third semiconductor substrate provided with respective circuits different from the sensor circuit,
wherein the first semiconductor substrate serves as an uppermost layer, and the first semiconductor substrate, the second semiconductor substrate, and the third semiconductor substrate are stacked on each other in three layers,
a metal element for an electrode constituting an electrode for external connection is disposed in the first semiconductor substrate, and
a metal element for an electrode constituting an electrode for a measuring terminal is disposed within the second semiconductor substrate or the third semiconductor substrate, and the first semiconductor substrate is stacked after performing a predetermined measurement, wherein a probe mark formed on the measuring electrode is planarized for measuring before stacking.

* * * * *